(12) United States Patent
Matsuzaki et al.

(10) Patent No.: US 9,601,429 B2
(45) Date of Patent: Mar. 21, 2017

(54) SEMICONDUCTOR DEVICE, ELECTRONIC COMPONENT, AND ELECTRONIC DEVICE INCLUDING MEMORY CELL COMPRISING FIRST TRANSISTOR, SECOND TRANSISTOR AND CAPACITOR

(71) Applicant: Semiconductor Energy Laboratory Co., Ltd., Atsugi-shi, Kanagawa-ken (JP)

(72) Inventors: Takanori Matsuzaki, Kanagawa (JP); Hiroki Inoue, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/090,733

(22) Filed: Apr. 5, 2016

(65) Prior Publication Data
US 2016/0218061 A1    Jul. 28, 2016

Related U.S. Application Data

(63) Continuation of application No. 14/689,275, filed on Apr. 17, 2015, now Pat. No. 9,311,982.

(30) Foreign Application Priority Data

Apr. 25, 2014 (JP) .................................. 2014-091432
Sep. 5, 2014 (JP) .................................. 2014-180982
Jan. 30, 2015 (JP) .................................. 2015-016508

(51) Int. Cl.
*G11C 11/24* (2006.01)
*H01L 23/528* (2006.01)
(Continued)

(52) U.S. Cl.
CPC .......... *H01L 23/528* (2013.01); *G11C 7/1048* (2013.01); *G11C 7/1051* (2013.01);
(Continued)

(58) Field of Classification Search
CPC .... G11C 11/404; G11C 11/405; H01L 27/108
(Continued)

(56) References Cited

U.S. PATENT DOCUMENTS 5,731,856 A  3/1998 Kim et al.
5,744,864 A  4/1998 Cillessen et al.
(Continued)

FOREIGN PATENT DOCUMENTS

EP    1737044 A    12/2006
EP    2226847 A    9/2010
(Continued)

OTHER PUBLICATIONS

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.
(Continued)

*Primary Examiner* — Connie Yoha
(74) *Attorney, Agent, or Firm* — Fish & Richardson P.C.

(57) ABSTRACT

A highly reliable semiconductor device. In a configuration where a precharged source line is discharged to a bit line by establishing electrical continuity between the source line and the bit line through a transistor to read a potential retained at a gate of the transistor, the potential of the bit line is switched in accordance with a change in potential of the source line due to the discharge. With this configuration, the voltage between the source and drain of the transistor can be kept lower than a predetermined voltage by discharge. Accordingly, the source-drain voltage of the transistor can
(Continued)

be kept lower than its breakdown voltage, so that the semiconductor device can have high reliability.

19 Claims, 36 Drawing Sheets

(51) Int. Cl.
*H01L 29/24* (2006.01)
*H01L 29/16* (2006.01)
*H01L 27/12* (2006.01)
*H01L 29/786* (2006.01)
*G11C 7/10* (2006.01)
*G11C 11/56* (2006.01)
*G11C 11/40* (2006.01)
G11C 15/04 (2006.01)
G11C 15/00 (2006.01)
G11C 11/404 (2006.01)

(52) U.S. Cl.
CPC .............. *G11C 11/24* (2013.01); *G11C 11/40* (2013.01); *G11C 11/56* (2013.01); *G11C 11/5621* (2013.01); *G11C 11/5642* (2013.01); *H01L 27/1207* (2013.01); *H01L 29/16* (2013.01); *H01L 29/24* (2013.01); *H01L 29/7869* (2013.01); *G11C 11/404* (2013.01); *G11C 15/00* (2013.01); *G11C 15/04* (2013.01); *G11C 15/046* (2013.01); *H01L 2924/0002* (2013.01)

(58) Field of Classification Search
USPC ......... 365/149, 185.23, 185.25, 185.09, 145; 257/43
See application file for complete search history.

(56) References Cited

U.S. PATENT DOCUMENTS

| | | | |
|---|---|---|---|
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,809,949 B2 * | 10/2004 | Ho ........................ | G11C 11/22 365/145 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,652,647 B2 | 1/2010 | Kageyama et al. | |
| 7,674,650 B2 | 3/2010 | Akimoto et al. | |
| 7,732,819 B2 | 6/2010 | Akimoto et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0129175 A1 * | 5/2009 | Masuda ................... | G11C 7/12 365/189.09 |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0089417 A1 | 4/2011 | Yamazaki et al. | |
| 2011/0101351 A1 | 5/2011 | Yamazaki | |
| 2011/0199816 A1 * | 8/2011 | Inoue ................... | G11C 11/403 365/149 |
| 2012/0012845 A1 * | 1/2012 | Kato ....................... | H01L 29/78 257/57 |
| 2012/0033488 A1 | 2/2012 | Nagatsuka et al. | |
| 2012/0294070 A1 | 11/2012 | Matsuzaki et al. | |
| 2014/0269099 A1 * | 9/2014 | Nagatsuka ......... | G11C 16/0441 365/185.23 |
| 2014/0286073 A1 | 9/2014 | Onuki | |
| 2015/0155289 A1 | 6/2015 | Inoue et al. | |

(56) References Cited

U.S. PATENT DOCUMENTS

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2012-256400 A | 12/2012 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physical Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. MAter. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUs on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IgZO Oxide TFT", SID Digest '08 : SID International Symposium Digest of Technical Papers, May 20, 2008, vol. 39, pp. 625-628.

(56) References Cited

OTHER PUBLICATIONS

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IgZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

FIG. 3A
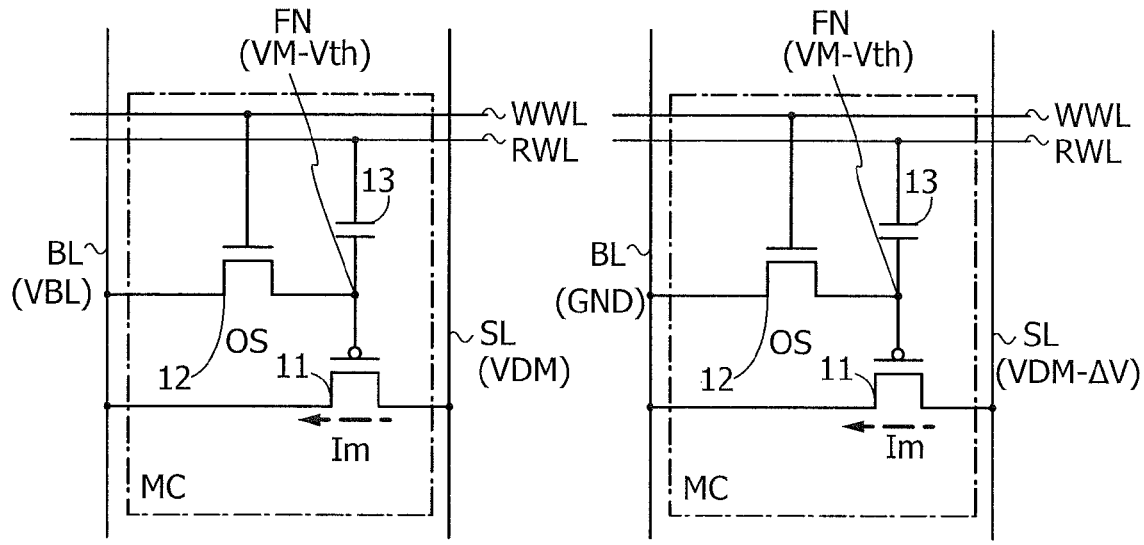
FIG. 3B
FIG. 3C
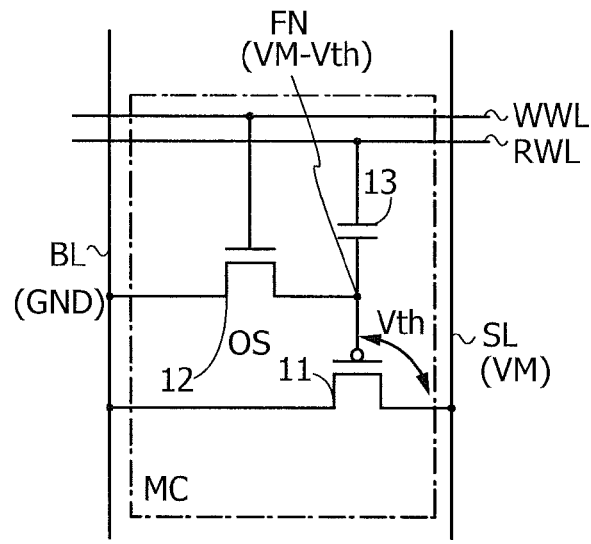

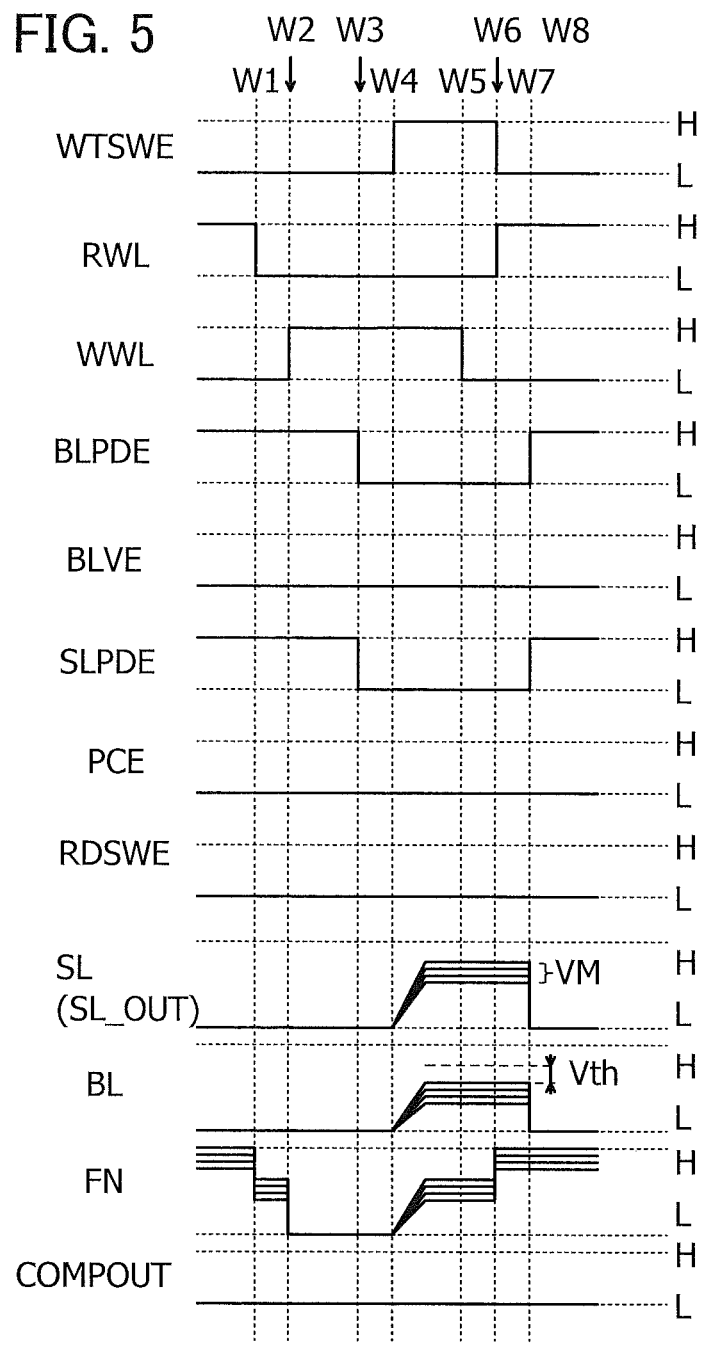

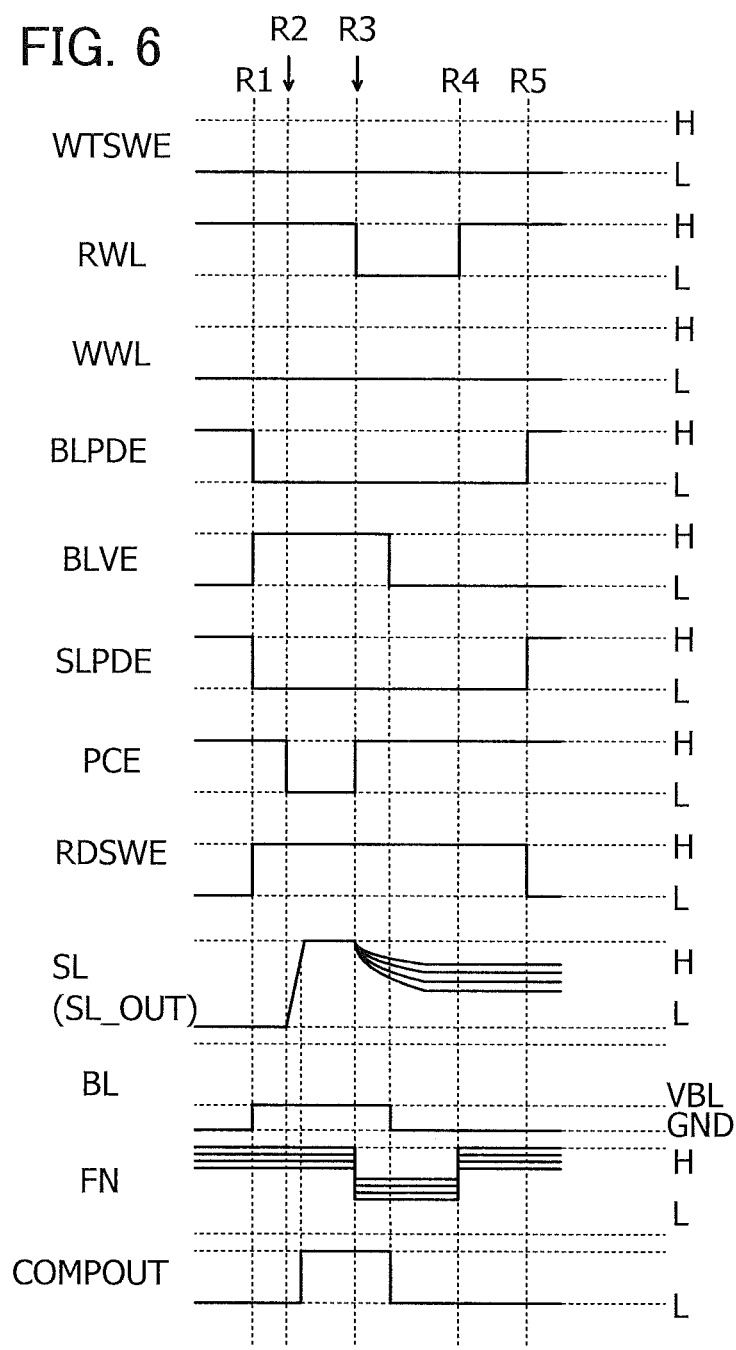

CAAC-OS nc-OS

□ non-CAAC   ⊟ CAAC as-sputtered after heat treatment at 450 °C

22

22

32

32

33   34   35

44

44

SEMICONDUCTOR DEVICE, ELECTRONIC COMPONENT, AND ELECTRONIC DEVICE INCLUDING MEMORY CELL COMPRISING FIRST TRANSISTOR, SECOND TRANSISTOR AND CAPACITOR

CROSS-REFERENCE TO RELATED APPLICATIONS

This application is a continuation of U.S. application Ser. No. 14/689,275, filed Apr. 17, 2015, now allowed, which claims the benefit of foreign priority applications filed in Japan as Serial No. 2014-091432 on Apr. 25, 2014, Serial No. 2014-180982 on Sep. 5, 2014 and Serial No. 2015-016508 on Jan. 30, 2015, all of which are incorporated by reference.

BACKGROUND OF THE INVENTION

1. Field of the Invention

One embodiment of the present invention relates to a semiconductor device, an electronic component, and an electronic device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a method for driving any of them, and a method for manufacturing any of them.

2. Description of the Related Art

Patent Document 1 discloses a semiconductor device including a transistor in which an oxide semiconductor is used for a channel formation region (hereinafter referred to as OS transistor) and a transistor in which silicon is used for a channel formation region (hereinafter referred to as Si transistor). Patent Document 1 also discloses that the OS transistor exhibits low off-state current.

REFERENCE

Patent Document 1: Japanese Published Patent Application No. 2012-256400

SUMMARY OF THE INVENTION

An object of one embodiment of the present invention is to provide a semiconductor device with a novel structure or the like.

Another object of one embodiment of the present invention is to provide a highly reliable semiconductor device or the like with a novel structure. Another object of one embodiment of the present invention is to provide a semiconductor device or the like with a novel structure in which voltage applied to a transistor can be less than a predetermined value. Another object of one embodiment of the present invention is to provide a semiconductor device or the like with a novel structure that is capable of retaining multilevel data.

Note that the objects of one embodiment of the present invention are not limited to the above. The objects described above do not disturb the existence of other objects. The other objects are objects that are not described above and will be described below. The other objects will be apparent from and can be derived from the description of the specification, the drawings, and the like by those skilled in the art. One embodiment of the present invention is to achieve at least one of the above objects and the other objects.

One embodiment of the present invention is a semiconductor device that includes a memory cell including a first transistor, a second transistor, and a capacitor; a first wiring; and a second wiring. The memory cell has a function of retaining charge corresponding to a data voltage at a node where one of electrodes of the capacitor, a gate of the first transistor, and one of a source and a drain of the second transistor are electrically connected to each other. A step for reading out and transferring the data voltage to the first wiring includes a first step, a second step, and a third step. The first step includes a step for precharging the first wiring. The second step includes a step for discharging a potential of the first wiring to the second wiring through the first transistor in accordance with the data voltage. The third step includes a step for bringing the potential of the first wiring close to a first potential. The first potential is the sum of a potential of the node and a threshold voltage of the first transistor. In the second step, a potential of the second wiring is switched in accordance with change in the potential of the first wiring.

One embodiment of the present invention is a semiconductor device that includes a memory cell including a first transistor, a second transistor, and a capacitor; a first wiring; and a second wiring. The memory cell has a function of retaining charge corresponding to a data voltage at a node where one of electrodes of the capacitor, a gate of the first transistor, and one of a source and a drain of the second transistor are electrically connected to each other. A step for reading out and transferring the data voltage to the first wiring includes a first step, a second step, and a third step. The first step includes a step for precharging the first wiring. The second step includes a step for discharging a potential of the first wiring to the second wiring through the first transistor in accordance with the data voltage. The third step includes a step for bringing the potential of the first wiring close to a first potential. The first potential is the sum of a potential of the node and a threshold voltage of the first transistor. In the second step, a difference between a potential of the second wiring and the potential of the first wiring is controlled to be less than a given voltage.

In the semiconductor device of one embodiment of the present invention, the first transistor preferably includes a semiconductor layer containing silicon.

In the semiconductor device of one embodiment of the present invention, the second transistor preferably includes a semiconductor layer containing an oxide semiconductor.

Note that other embodiments of the present invention will be shown in Embodiments 1 to 6 and the drawings.

One embodiment of the present invention can provide a semiconductor device or the like with a novel structure.

Another embodiment of the present invention can provide a highly reliable semiconductor device or the like with a novel structure. Another embodiment of the present invention can provide a semiconductor device or the like with a novel structure in which voltage applied to a transistor can be less than a predetermined value. Another embodiment of the present invention can provide a semiconductor device or the like with a novel structure that is capable of retaining multilevel data. Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

In the accompanying drawings:

FIGS. 3A to 3C are circuit diagrams illustrating one embodiment of the present invention;

FIG. 5 is a timing chart for explaining one embodiment of the present invention;

FIG. 6 is a timing chart for explaining one embodiment of the present invention;

DETAILED DESCRIPTION OF THE INVENTION

Figure 1:
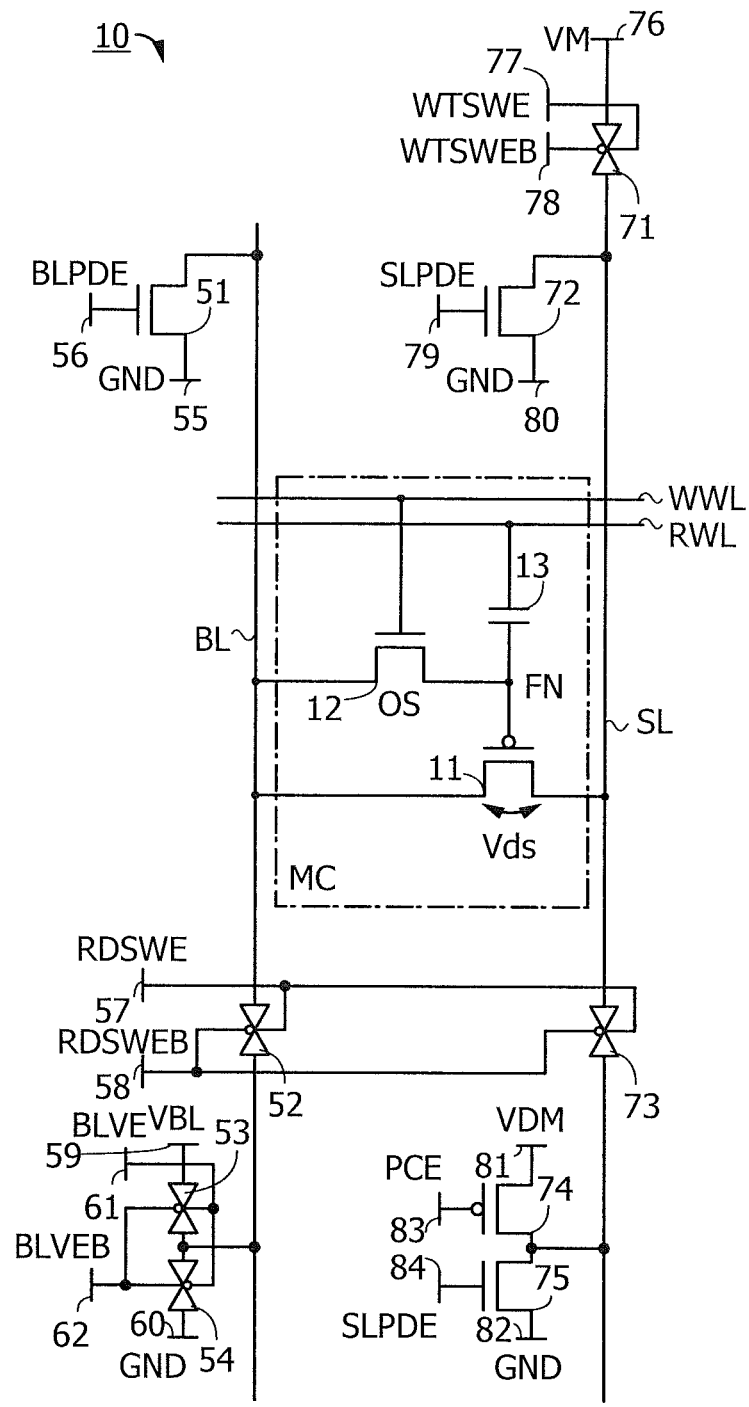
FIG. 1 is a circuit diagram illustrating one embodiment of the present invention.

Embodiments will be described below with reference to the drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings. For example, variation in signal, voltage, or current due to noise or difference in timing can be included.

In this specification and the like, a transistor is an element having at least three terminals: a gate, a drain, and a source. The transistor has a channel region between the drain (a drain terminal, a drain region, or a drain electrode) and the source (a source terminal, a source region, or a source electrode), and current can flow through the drain, the channel region, and the source.

Since the source and the drain of the transistor may change depending on the structure, operating conditions, and the like of the transistor, it is difficult to define which is a source or a drain. Thus, it is possible that a portion functioning as the source and a portion functioning as the drain are not called a source and a drain, and that one of the source and the drain is referred to as a first electrode and the other is referred to as a second electrode.

In this specification, ordinal numbers such as first, second, and third are used to avoid confusion among components, and thus do not limit the number of the components.

In this specification, the expression "A and B are connected" means the case where A and B are electrically connected to each other in addition to the case where A and B are directly connected to each other. Here, the expression "A and B are electrically connected" means the case where electric signals can be transmitted and received between A and B when an object having any electric action exists between A and B.

For example, any of the following expressions can be used for the case where a source (or a first terminal or the like) of a transistor is electrically connected to X through Z1 (or not through Z1) and a drain (or a second terminal or the like) of the transistor is electrically connected to Y through Z2 (or not through Z2), or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include "X, Y, and a source (or a first terminal or the like) and a drain (or a second terminal or the like) of a transistor are electrically connected to each other such that X, the source (or the first terminal or the like) of the transistor, the drain (or the second terminal or the like) of the transistor, and Y are electrically connected to each other in this order"; "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order"; and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope. Note that these expressions are only examples, and there is no limitation on the expressions. Here, X, Y, Z1, and Z2 each denote an object (e.g., a device, an element, a circuit, a wiring, an electrode, a terminal, a conductive film, or a layer).

In this specification, terms for explaining arrangement, such as over and under, are used for convenience to describe the positional relation between components with reference to drawings. The positional relation between components is changed as appropriate in accordance with a direction in which each component is described. Thus, the positional relation is not limited to that described with a term used in this specification and can be explained with another term as appropriate depending on the situation.

The positional relation of circuit blocks in a block diagram is specified for description. Even when a block diagram shows that different functions are achieved by different circuit blocks, one circuit block may be actually configured to achieve different functions. Functions of circuit blocks in a diagram are specified for description, and even when a diagram shows one circuit block performing given processing, a plurality of circuit blocks may be actually provided to perform the processing.

In this specification, the term "parallel" indicates that an angle formed between two straight lines ranges from −10° to 10°, and accordingly also includes the case where the angle ranges from −5° to 5°. The term "perpendicular" indicates that the angle formed between two straight lines ranges from 80° to 100°, and accordingly also includes the case where the angle ranges from 85° to 95°.

In this specification, trigonal and rhombohedral crystal systems are included in a hexagonal crystal system.

(Embodiment 1)

In this embodiment, a configuration example and the operation of a memory cell MC that is one example of a semiconductor device, and an example of a block diagram including the memory cell MC will be described.

In this specification and the like, a semiconductor device means any device that can function by utilizing semiconductor characteristics; thus, a memory cell composed of semiconductor elements such as transistors, a peripheral circuit for controlling the memory cell, and a system including the memory cell and the peripheral circuit are included in the category of the semiconductor device.

<Configuration Example of Memory Cell MC>

FIG. 1 illustrates a configuration example of a semiconductor device 10 including the memory cell MC.

The memory cell MC includes a transistor 11, a transistor 12, and a capacitor 13. The memory cell MC is connected to a wiring BL, a wiring SL, a wiring WWL, and a wiring RWL.

The wiring SL may be referred to as a source line or a first wiring. The wiring BL may be referred to as a bit line or a second wiring. The wiring WWL may be referred to as a write word line. The wiring RWL may be referred to as a read word line.

The wiring BL is connected to a transistor 51, a switch 52, a switch 53, and a switch 54. The elements connected to the wiring BL are connected to wirings 55 to 62. Each of the wirings 55 to 62 is supplied with a signal or a potential that is supplied to the elements connected to the wiring BL.

The wiring SL is connected to a switch 71, a transistor 72, a switch 73, a transistor 74, and a transistor 75. The elements connected to the wiring SL are connected to wirings 76 to 84. Each of the wirings 76 to 84 is supplied with a signal or a potential that is supplied to the elements connected to the wiring SL.

The wiring SL is supplied with a voltage VM that is data under control of the switch 71. The data VM is supplied to the wiring 76, and then supplied to the wiring SL through the switch 71. The on/off state of the switch 71 is controlled in response to signals WTSWE and WTSWEB supplied to the wirings 77 and 78.

The wiring SL is supplied with a potential for initialization, here a ground potential GND, under control of the transistor 72. The ground potential GND is supplied to the wiring 80, and then supplied to the wiring SL through the transistor 72. The on/off state (conduction state) of the transistor 72 is controlled in response to a signal SLPDE supplied to the wiring 79.

The wiring SL is supplied with a precharge potential VDM or the ground potential GND under control of the switch 73. The on/off state of the switch 73 is controlled in response to signals RDSWE and RDSWEB supplied to the wirings 57 and 58.

The precharge potential VDM is supplied to the wiring 81, and then supplied to the wiring SL through the transistor 74 and the switch 73. The ground potential GND is supplied to the wiring 82, and then supplied to the wiring SL through the transistor 75 and the switch 73. The on/off state of the transistor 74 is controlled in response to a signal PCE supplied to the wiring 83. The on/off state of the transistor 75 is controlled in response to the signal SLPDE supplied to the wiring 84.

The wiring BL is supplied with a potential for initialization, here the ground potential GND, under control of the transistor 51. The ground potential GND is supplied to the wiring 55, and then supplied to the wiring BL through the transistor 51. The on/off state of the transistor 51 is controlled in response to a signal BLPDE supplied to the wiring 56.

The wiring BL is supplied with a first potential and a second potential, here a potential VBL and the ground potential GND under control of the switch 52. The on/off state of the switch 52 is controlled in response to the signals RDSWE and RDSWEB supplied to the wirings 57 and 58.

The potential VBL is supplied to the wiring 59, and then supplied to the wiring BL through the switch 53 and the switch 52. The ground potential GND is supplied to the wiring 60, and then supplied to the wiring BL through the switch 54 and the switch 52. The on/off states of the switches 53 and 54 are controlled in response to signals BLVE and BLVEB supplied to the wirings 61 and 62.

A gate of the transistor 11 is connected to one of a source and a drain of the transistor 12 and one electrode of the capacitor 13. One of a source and a drain of the transistor 11 is connected to the wiring SL. The other of the source and the drain of the transistor 11 is connected to the wiring BL.

Although the transistor 11 is a p-channel transistor in FIG. 1, the transistor 11 may be an n-channel transistor. The transistor 11 is preferably a Si transistor. The use of a Si transistor as the transistor 11 can reduce threshold voltage variation and increase the amount of current flowing through the transistor 11.

In FIG. 1, a node FN refers to a node where the gate of the transistor 11 (i.e., the one of the source and the drain of the transistor 12) and the one electrode of the capacitor 13 are connected to each other. The potential of the node FN is changed by supply of the potential of the wiring BL through the transistor 12 or by capacitive coupling generated when the node FN is made electrically floating and then the potential of the wiring RWL is changed.

The on/off state of the transistor 11 is controlled in response to the potential of the node FN. When the absolute value of a voltage between the gate and source (hereinafter Vgs) of the transistor 11 exceeds the threshold voltage, the transistor 11 is turned on and current flows therethrough. Thus, the wiring BL has a potential (VM−Vth) that is lower than the data voltage VM, which is the potential of the wiring SL, by the threshold voltage of the transistor 11.

A gate of the transistor 12 is connected to the wiring WWL. The one of the source and the drain of the transistor 12 is connected to the node FN. The other of the source and the drain of the transistor 12 is connected to the wiring BL.

Although the transistor 12 is an n-channel transistor in FIG. 1, the transistor 12 may be a p-channel transistor. The transistor 12 is preferably an OS transistor. The use of an OS transistor as the transistor 12 can reduce an off-state current, which flows between the source and drain in an off state.

In the circuit diagrams, "OS" is used to denote an OS transistor.

The on/off state of the transistor 12 is controlled depending on the potential of the wiring WWL. The transistor 12 can set the node FN at the potential of the wiring BL by being turned on, and can make the node FN electrically floating by being turned off. Thus, the node FN can retain the potential (VM−Vth), which is lower than the data voltage VM by the threshold voltage of the transistor 11.

The one electrode of the capacitor 13 is connected to the node FN. The other electrode of the capacitor 13 is connected to the wiring RWL.

A write word signal WWS is supplied to the wiring WWL. The write word signal WWS at H level turns on the transistor 12 and that at L level turns off the transistor 12.

A read word signal RWS is supplied to the wiring RWL. When the node FN is electrically floating, the read word signal RWS at H level increases the potential of the node FN and that at L level decreases the potential of the node FN.

In one embodiment of the present invention, the circuit configuration in FIG. 1 enables a data voltage to be read out and transferred to the wiring SL without an increase in the voltage between the source and drain of the transistor 11.

To read data in the circuit configuration of FIG. 1, electrical continuity is established between the precharged wiring SL and the wiring BL through the transistor 11 and the wiring SL is discharged, so that the potential of the node FN is read out. In the circuit configuration of FIG. 1, the potential of the wiring BL is switched in accordance with a variation in potential of the wiring SL during the discharge. Specifically, the potential of the wiring BL can be switched between the potential VBL supplied through the switch 53 and the ground potential GND supplied through the switch 54.

With this configuration, the voltage between the source and drain of the transistor 11 can be kept lower than a predetermined voltage by discharge. Accordingly, the source-drain voltage of the transistor 11 can be kept lower than its breakdown voltage, so that the semiconductor device can have high reliability. Since a voltage applied to the transistor 11 can be lower than a predetermined value, the semiconductor device can retain multilevel data.

<Operation Example of Memory Cell MC>

Next, an operation example of the memory cell MC will be described.

Figure 2A:
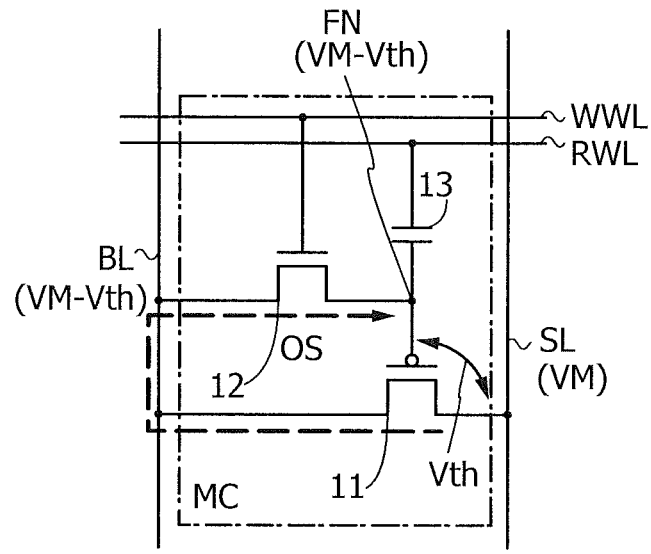
FIGS. 2A and 2B are circuit diagrams illustrating one embodiment of the present invention.

Writing of data to the memory cell MC is schematically shown in a circuit diagram of FIG. 2A.

As illustrated in FIG. 2A, the data voltage VM supplied to the wiring SL is reduced by the threshold voltage of the transistor 11, and the potential (VM−Vth) is supplied to the wiring BL. The potential (VM−Vth) supplied to the wiring BL is supplied to the node FN through the transistor 12. A dotted arrow in FIG. 2A indicates the flow of charge at the time of writing data to the memory cell MC. The threshold voltage of the transistor 11 is represented as Vth in circuit diagrams.

Specifically, data is written in the following manner. First, the transistor 12 is turned off to set the node FN electrically floating. The potential of the wiring RWL is lowered while the node FN is electrically floating. Thus, the potential of the node FN is lowered by capacitive coupling through the capacitor 13, and the transistor 11 turns on. Then, the transistor 12 is turned on, and a potential of the wiring BL that corresponds to the potential of the wiring SL is supplied to the node FN. Next, the transistor 12 is turned off to set the node FN electrically floating. The potential of the wiring RWL is increased while the node FN is electrically floating. Thus, the potential of the node FN is increased from the potential (VM−Vth) by a predetermined potential, and the transistor 11 turns off, whereby data writing is completed. For data writing, the potentials of the wirings BL and SL are preferably initialized to the ground potential.

Figure 2B:
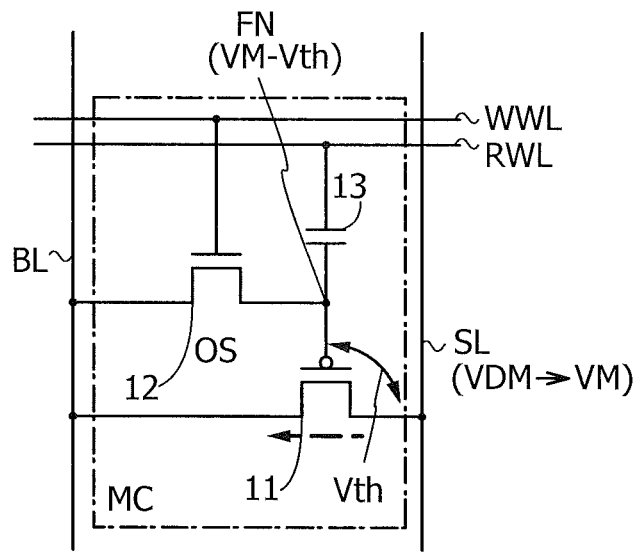

Reading of data from the memory cell MC is schematically shown in a circuit diagram of FIG. 2B.

To read the potential (VM−Vth) retained at the node FN as illustrated in FIG. 2B, the wiring SL is precharged at the potential VDM. The potential of the node FN is changed by changing the potential of the wiring RWL, whereby the transistor 11 is turned on. Thus, the potential of the wiring SL changes from the precharged potential VDM to the potential VM. A dotted arrow in FIG. 2B indicates the flow of charge between the wirings SL and BL.

Specifically, data is read out in the following manner. First, the transistor 12 is turned off to set the node FN electrically floating. Then, the wiring SL is precharged at the potential VDM. Next, the potential of the wiring RWL is lowered. Since the node FN is electrically floating, the potential of the node FN is decreased by a predetermined potential and becomes the potential (VM−Vth), and the transistor 11 turns on. When the transistor 11 turns on, the potential of the wiring SL decreases. The potential of the wiring SL continues to decrease until Vgs of the transistor 11 becomes the threshold voltage Vth. The potential of the wiring SL eventually becomes the potential VM, which is the sum of the potential (VM−Vth) of the node FN and the threshold voltage Vth of the transistor 11. As a result, the data voltage VM written to the memory cell MC can be read out and transferred to the wiring SL.

In data reading shown in FIG. 2B, the precharge potential for reading data is preferably large, in which case the data voltage VM can be large. A large data voltage VM can obtain distribution of a plurality of voltages, so that multilevel data can be retained in the memory cell MC.

Meanwhile, a large precharge potential increases the voltage between the source and drain (hereinafter Vds) of the transistor 11. When the transistor 11 is a Si transistor fabricated with a fine process, its withstand voltage is approximately 2 V, for example; therefore, Vds is preferably low.

In the configuration of one embodiment of the present invention, Vds of the transistor 11 can be lower than a predetermined voltage even when a precharge potential supplied to the wiring SL is increased. A specific operation for keeping Vds of the transistor 11 lower than a predetermined voltage is schematically shown in circuit diagrams of FIGS. 3A to 3C.

At the beginning of data reading, the potential of the wiring BL is set such that a potential difference between the potential of the wiring BL and a precharge potential does not exceed the breakdown voltage of the transistor 11. For example, the potential of the wiring BL is set at the potential VBL as illustrated in FIG. 3A. The voltage Vds for making a current Im flow is applied between the source and drain of the transistor 11, so that the wiring SL can be discharged through the transistor 11.

The potential of the wiring SL decreases in response to discharge of the wiring SL through the transistor 11. If the potential of the wiring SL falls below a given potential, the voltage Vds high enough to make the current Im flow is lost. In view of this, in one embodiment of the present invention, the potential of the wiring BL is switched in response to a reduction in potential of the wiring SL so that the voltage Vds for making the current Im flow is obtained. For example, as illustrated in FIG. 3B, the potential of the wiring BL is changed to the ground potential GND, which is lower than the potential VBL. Since the voltage Vds for making the current Im flow is applied between the source and drain of the transistor 11, discharge of the wiring SL through the transistor 11 can be continued even when the potential of the wiring SL decreases to (VDM−ΔV).

The potential of the wiring SL continues to decrease until Vgs of the transistor 11 becomes the threshold voltage Vth. As illustrated in FIG. 3C, the potential of the wiring SL eventually becomes the potential VM, which is the sum of the potential (VM−Vth) of the node FN and the threshold voltage Vth of the transistor 11. As a result, the data voltage VM written to the memory cell MC can be read out and transferred to the wiring SL.

In one embodiment of the present invention, with the operation illustrated in FIGS. 3A to 3C, a data voltage can be read out and transferred to the wiring SL without an increase in Vds of the transistor 11.

According to the operation illustrated in FIGS. 3A to 3C, at the time of data reading, electrical continuity is established between the precharged wiring SL and the wiring BL through the transistor 11 and the wiring SL is discharged, so that the potential of the node FN is read out. In the circuit configuration of FIG. 1, the potential of the wiring BL is switched in accordance with a variation in potential of the wiring SL during the discharge. Specifically, the potential of the wiring BL can switch between the potential VBL and the ground potential GND.

With this configuration, the voltage between the source and drain of the transistor 11 can be kept lower than a predetermined voltage by discharge. Thus, the source-drain voltage of the transistor 11 can be kept lower than its breakdown voltage, so that the semiconductor device can have high reliability. Since a voltage applied to the transistor 11 can be lower than a predetermined value, the semiconductor device can retain multilevel data.

<Block Diagram>

Figure 4:
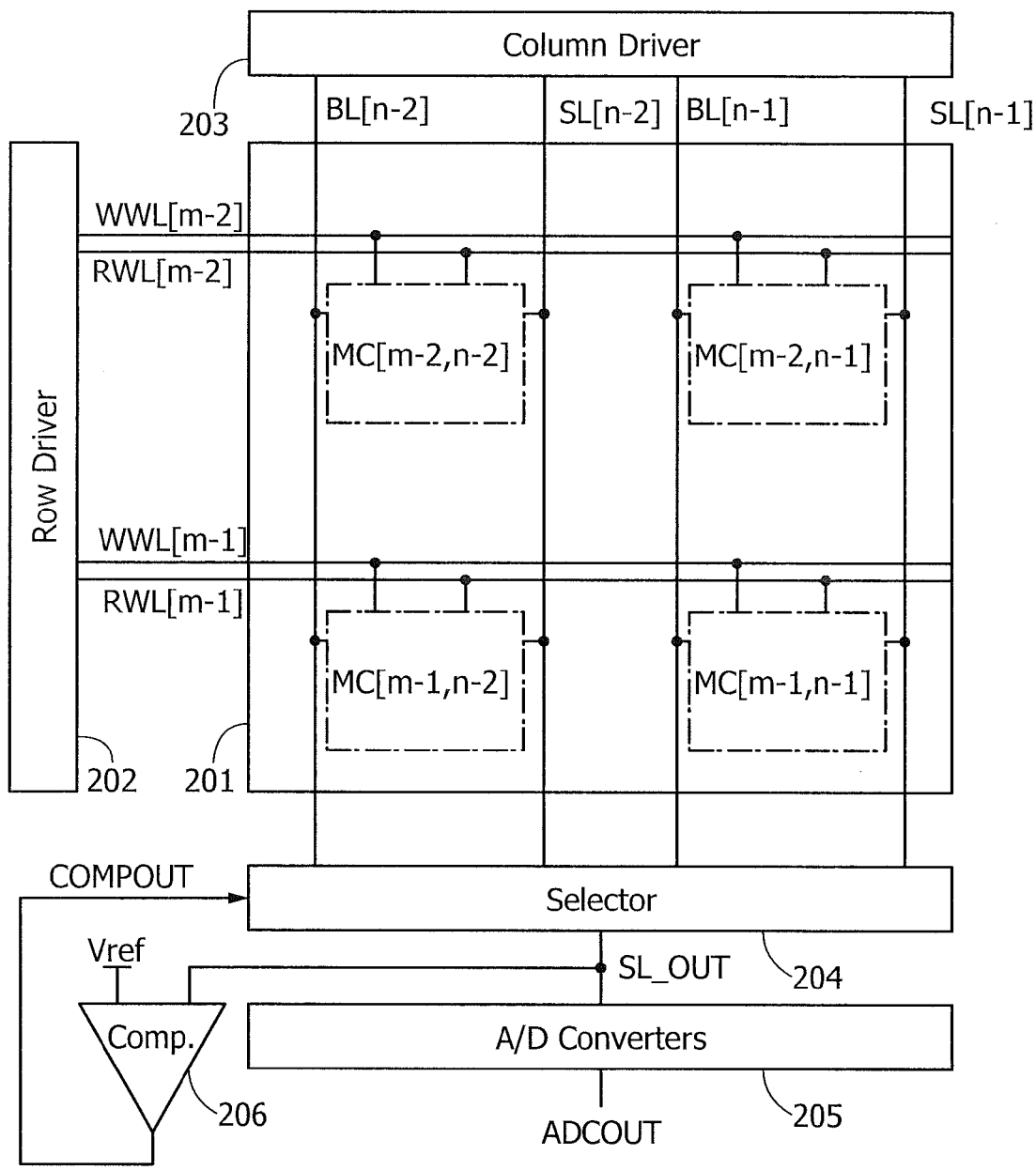
FIG. 4 is a block diagram illustrating one embodiment of the present invention.

The memory cell MC described above can be arranged in a configuration illustrated in a block diagram of FIG. 4 as an example.

A semiconductor device 200 illustrated in FIG. 4 includes a memory cell array 201 in which a memory cell MC[m−2, n−2], a memory cell MC[m−1, n−2], a memory cell MC[m−2, n−1], and a memory cell MC[m−1, n−1] are arranged in a matrix.

In addition to the memory cells MC, the memory cell array 201 also includes a wiring WWL[m−2], a wiring WWL[m−1], a wiring RWL[m−2], a wiring RWL[m−1], a wiring BL[n−2], a wiring BL[n−1], a wiring SL[n−2], and a wiring SL[n−1].

In addition to the memory cell array 201, the semiconductor device 200 also includes a row driver 202, a column driver 203, a selector 204, A/D converters 205, and a comparator 206, for example.

The row driver 202 outputs signals supplied to the wiring WWL[m−2], the wiring WWL[m−1], the wiring RWL[m−2], and the wiring RWL[m−1].

The column driver 203 outputs a signal for writing data to the memory cell MC to the wiring BL[n−2], the wiring BL[n−1], the wiring SL[n−2], and the wiring SL[n−1].

The selector 204 selects the wiring BL[n−2], the wiring BL[n−1], the wiring SL[n−2], and the wiring SL[n−1] and outputs a signal for reading data in the memory cell MC. The data voltage VM read from the memory cell MC is output to the A/D converters 205 and the comparator 206 as a signal SL_OUT.

The A/D converters 205 have a function of converting data of the memory cell MC, which is read through the wiring SL[n−2] or the wiring SL[n−1] selected by the selector 204, into digital data and outputting the digital data. The digital data obtained in the A/D converters 205 is output to the outside as a signal ADCOUT.

The comparator 206 has a function of comparing the signal SL_OUT, which is the data voltage VM read from the memory cell MC, and a reference voltage Vref. In data reading, the comparator 206 senses a reduction in potential of the wiring SL, and the potential of the wiring BL can be switched accordingly. When a signal COMPOUT output from the comparator 206 is switched in response to the reduction in potential of the wiring SL, the selector 204 can select a potential supplied to the wiring BL between the potential VBL and the ground potential GND.

Note that the comparator 206 can be omitted when a comparison circuit included in the A/D converters 205 is used instead.

In one embodiment of the present invention, the configuration in the block diagram of FIG. 4 enables a data voltage to be read out and transferred to the wiring SL without an increase in the voltage between the source and drain of the transistor 11.

Since the configuration in the block diagram of FIG. 4 includes the comparator 206, the potential of the wiring SL can be monitored at the time of data reading. Thus, a potential change due to discharge of the wiring SL can be sensed. Accordingly, switching the potential of the wiring BL in accordance with a potential change of the wiring SL can be performed such that the potential difference between the wiring SL and the wiring BL is less than a given voltage.

With this configuration, the voltage between the source and drain of the transistor 11 can be kept lower than a predetermined voltage by discharge. Thus, the source-drain voltage of the transistor 11 can be kept lower than its breakdown voltage, so that the semiconductor device can have high reliability. Since a voltage applied to the transistor 11 can be lower than a predetermined value, the semiconductor device can retain multilevel data.

<Timing Charts>

Next, the description is made on timing charts showing signals and potentials of wirings at the time of data writing and data reading of the memory cell MC described above. FIG. 5 is a timing chart showing data writing. FIG. 6 is a timing chart showing data reading.

According to the timing chart in FIG. 5, at time W1, the potential of the wiring RWL is set at L level to lower the potential of the node FN. Note that the node FN retains distribution of a plurality of voltages VM corresponding to multilevel data.

Next, at time W2, the potential of the wiring WWL is set at H level so that the transistor 12 is turned on and the potential of the node FN is decreased to L level, that is, the ground potential. An L-level potential of the node FN makes the transistor 11 turn on. The transistors 11 and 12 remain on. With the steps so far, an initialization operation before data writing to the memory cell MC is completed.

Then, at time W3, the signal BLPDE is set at L level so that the wiring 55 and the wiring BL are electrically separated from each other. Moreover, at the time W3, the signal SLPDE is set at L level so that the wiring 80 and the wiring SL are electrically separated from each other.

Subsequently, at time W4, the signal WTSWE is set at H level so that the voltage VM corresponding to multilevel data is supplied to the wiring SL. Since the transistors 11 and 12 are on, the potentials of both the wiring BL and the node FN change. As described above, the potentials of the wiring BL and the node FN become the potential (VM−Vth), which is lower than the data voltage VM by the threshold voltage of the transistor 11.

Then, at time W5, the potential of the wiring WWL is set at L level to turn off the transistor 12. The node FN is brought into an electrically floating state while retaining charge corresponding to the data voltage (VM−Vth).

Next, at time W6, the potential of the wiring RWL is set at H level. The node FN is electrically floating because the transistor 12 is off. Thus, the potential of the node FN is increased by capacitive coupling through the capacitor 13.

Then, the transistor 11 is turned off. Furthermore, the signal WTSWE is set at L level so that supply of the voltage VM to the wiring SL is stopped.

Subsequently, at time W7, the signal BLPDE is set at H level so that the wiring BL is set at the ground potential GND. Moreover, at the time W7, the signal SLPDE is set at H level so that the wiring SL is set at the ground potential GND. With the steps so far, an operation of writing data to the memory cell MC is completed.

Through the sequence described above, data writing can be performed. Data written to the node FN of the memory cell MC can be retained by keeping the transistor 12 off.

FIG. 6 is a timing chart showing data reading.

According to the timing chart in FIG. 6, at time R1, the signal BLPDE is set at L level, the signal BLVE is set at H level, the signal SLPDE is set at L level, and the signal RDSWE is set at H level. Note that the signal BLVEB obtained by inverting the signal BLVE is set at L level, and the signal RDSWEB obtained by inverting the signal RDSWE is set at L level. Moreover, the wiring BL is set at the potential VBL, and the wiring SL is set at the ground potential GND.

Then, at time R2, the signal PCE is set at L level so that the wiring SL is set at H level, that is, the potential VDM. An increase in potential of the wiring SL makes the signal COMPOUT at H level.

Subsequently, at time R3, the signal PCE is set at H level so that the wiring SL is brought into an electrically floating state. Then, the potential of the wiring RWL is set at L level to lower the potential of the node FN. Thus, a current flows through the transistor 11 in accordance with the potential of the node FN, and the potential of the wiring SL changes. When this potential change causes the voltage between the wiring SL and the wiring BL to be lower than a predetermine voltage, the signal COMPOUT becomes L level and the levels of the signal BLVE and the signal BLVEB are switched.

With this configuration, the voltage between the source and drain of the transistor 11 can be kept lower than a predetermined voltage by discharge. Thus, the source-drain voltage of the transistor 11 can be kept lower than its breakdown voltage, so that the semiconductor device can have high reliability. Since a voltage applied to the transistor 11 can be lower than a predetermined value, the semiconductor device can retain multilevel data.

At time R4, Vgs of the transistor 11 becomes the threshold voltage and a current flowing through the transistor 11 is reduced, so that a change in potential of the wiring SL stops. Moreover, at the time R4, the potential of the wiring RWL is set at H level to turn off the transistor 11.

Based on the change in potential of the wiring SL, the voltage VM obtained at the wiring SL is the sum of the potential (VM−Vth) of the node FN and the threshold voltage Vth of the transistor 11. That is, the read voltage can be obtained as the voltage VM where the term of the threshold voltage of the transistor 11 is canceled. Accordingly, data can be read out without adverse effect of the threshold voltage of the transistor 11 on the data voltage VM. Thus, the node FN can retain distribution of a plurality of voltages; in other words, data multiplication is easily achieved.

Since the amount of potential change is small, one embodiment of the present invention does not require a verify operation for verifying whether data is written correctly.

Subsequently, at time R5, the signal BLPDE is set at H level so that the wiring BL is set at the ground potential GND. Moreover, at the time R5, the signal SLPDE is set at H level so that the wiring SL is set at the ground potential GND. With the steps so far, an operation of reading out and transferring data to the memory cell MC is completed.

Through the sequence described above, data reading can be performed.

With the configuration described in this embodiment, the voltage between the source and drain of the transistor 11 can be kept lower than a predetermined voltage by discharge of the wiring SL at the time of data reading. Thus, the source-drain voltage of the transistor 11 can be kept lower than its breakdown voltage, and the semiconductor device can have high reliability. Since a voltage applied to the transistor 11 can be lower than a predetermined value, the semiconductor device can retain multilevel data.

Although the circuit configuration described in this embodiment is applied to a memory cell, one embodiment of the present invention is not limited to this example. Depending on circumstances or conditions, one embodiment of the present invention can be applied to a circuit other than a memory cell. Examples of circuits other than a memory cell include a logic circuit and a switch.

Although a transistor containing an oxide semiconductor is used in the circuit configuration described in this embodiment, one embodiment of the present invention is not limited to this example. Depending on circumstances or conditions, the OS transistor may be replaced with a transistor containing a semiconductor material that is not an oxide semiconductor in one embodiment of the present invention. For example, in one embodiment of the present invention, a transistor containing silicon, germanium, or the like may be substituted for the OS transistor.

Note that the structures, methods, and the like described in this embodiment can be used as appropriate in combination with any of the structures, methods, and the like described in the other embodiments.

(Embodiment 2)

This embodiment will show circuit configuration examples of the memory cell MC described in Embodiment 1 and a variation example of the switches 53 and 54.

<Circuit Configuration Examples of Memory Cell MC>

FIGS. 7A to 7D illustrate examples of a circuit configuration that the memory cell MC in FIG. 1 can have.

Figure 7A:
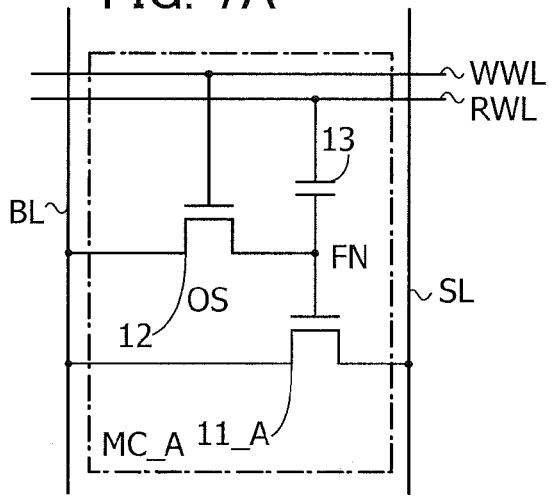
FIGS. 7A to 7D are circuit diagrams each illustrating one embodiment of the present invention.

A memory cell MC_A illustrated in FIG. 7A includes a transistor 11_A, the transistor 12, and the capacitor 13. The transistor 11_A is an n-channel transistor. The configuration in FIG. 7A can be applied to the memory cell MC in FIG. 1.

Figure 7B:
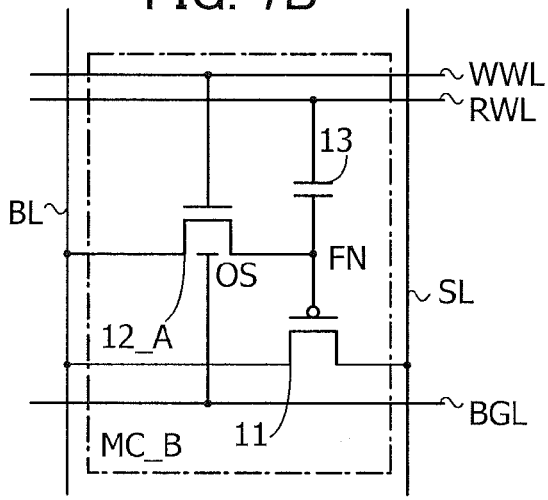

A memory cell MC_B illustrated in FIG. 7B includes the transistor 11, a transistor 12_A, and the capacitor 13. The transistor 12_A has a backgate that is controlled with a wiring BGL. This configuration enables control of the threshold voltage of the transistor 12_A. The configuration in FIG. 7B can be applied to the memory cell MC in FIG. 1.

Figure 7C:
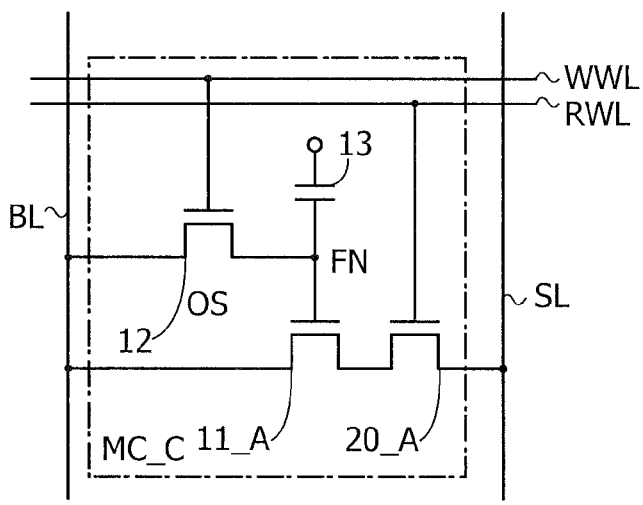

A memory cell MC_C illustrated in FIG. 7C includes the transistor 11_A, the transistor 12, the capacitor 13, and a transistor 20_A. The transistor 20_A is an n-channel transistor like the transistor 11_A. The configuration in FIG. 7C can be applied to the memory cell MC in FIG. 1.

Figure 7D:
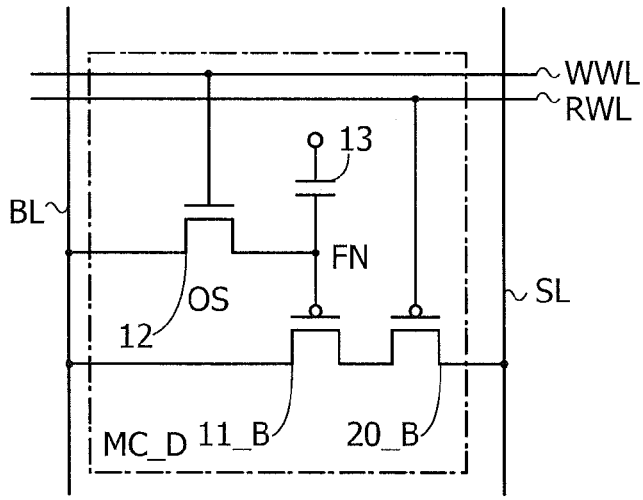

A memory cell MC_D illustrated in FIG. 7D includes a transistor 11_B, the transistor 12, the capacitor 13, and a transistor 20_B. The transistor 11_B and the transistor 20_B are p-channel transistors. The configuration in FIG. 7D can be applied to the memory cell MC in FIG. 1.

<Variation Example of Switches 53 and 54>

In the configuration example in FIG. 1, a potential supplied to the wiring BL at the time of data reading is switched between the potential VBL and the ground potential GND by switching the switches 53 and 54; however, another configuration may be employed.

Figure 8:
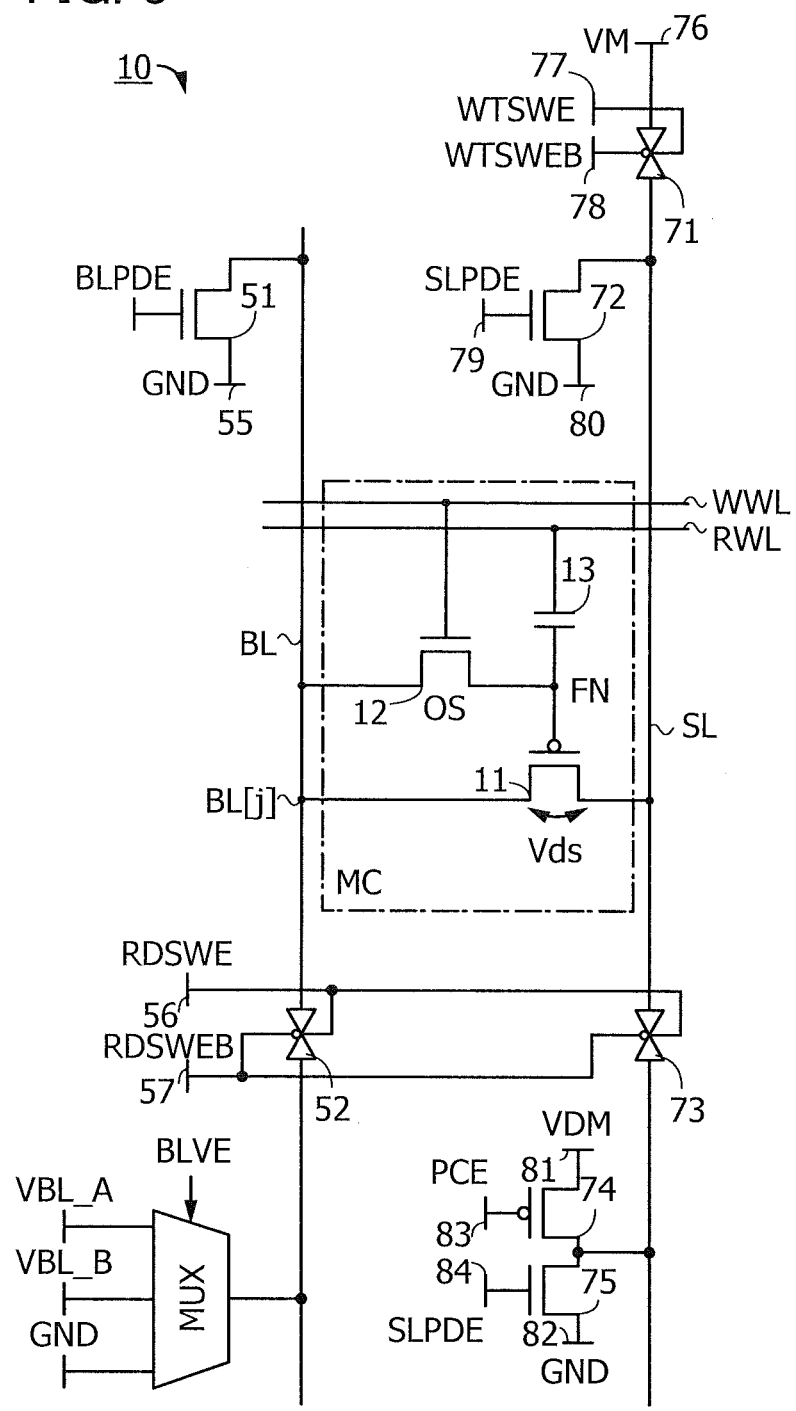
FIG. 8 is a circuit diagram illustrating one embodiment of the present invention.

For example, as in a circuit diagram of FIG. 8, a potential supplied to the wiring BL in data reading may be switched between a potential VBL_A, a potential VBL_B, and the ground potential GND by a multiplexer. The multiplexer is controlled with the signal BLVE.

This configuration allows the precharge potential VDM to increase, thereby increasing the number of distributions of potentials that the data voltage VM can have. Thus, the memory cell can retain multilevel data.

Note that the structures, methods, and the like described in this embodiment can be used as appropriate in combination with any of the structures, methods, and the like described in the other embodiments.

(Embodiment 3)

This embodiment will explain an OS transistor with a low off-state current that is shown in Embodiment 1 and an oxide semiconductor contained in a semiconductor layer of the OS transistor.

<OS Transistor>

The OS transistor shown as a transistor with a low off-state current in Embodiment 1 exhibits lower off-state current than a Si transistor.

The off-state current of an OS transistor can be reduced by reducing the concentration of impurities in an oxide semiconductor to make the oxide semiconductor intrinsic or substantially intrinsic. The term "substantially intrinsic" refers to a state where an oxide semiconductor has a carrier density lower than $1\times10^{17}/\text{cm}^3$, preferably lower than $1\times10^{15}/\text{cm}^3$, more preferably lower than $1\times10^{13}/\text{cm}^3$. In the oxide semiconductor, hydrogen, nitrogen, carbon, silicon, and metal elements other than main components are impurities. For example, hydrogen and nitrogen form donor levels to increase the carrier density.

A transistor using an intrinsic or substantially intrinsic oxide semiconductor has a low carrier density and thus is less likely to have negative threshold voltage. Moreover, because of few carrier traps in the oxide semiconductor, the transistor using the oxide semiconductor has small variation in electrical characteristics and high reliability. Furthermore, the transistor using the oxide semiconductor achieves an ultra-low off-state current.

For example, the OS transistor with reduced off-state current can exhibit a normalized off-state current per micrometer in channel width of $1\times10^{-18}$ A or less, preferably $1\times10^{-21}$ A or less, more preferably $1\times10^{-24}$ A or less at room temperature (approximately 25° C.), or $1\times10^{-15}$ A or less, preferably $1\times10^{-18}$ A or less, more preferably $1\times10^{-21}$ A or less at 85° C.

Note that the off-state current of an n-channel transistor is a current that flows between a source and a drain when the transistor is off. For example, the off-state current of an n-channel transistor with a threshold voltage of about 0 V to 2 V refers to a current that flows between a source and a drain when a negative voltage is applied between a gate and the source.

Therefore, the memory cell MC can retain charge at the node FN by turning off the OS transistor 12.

The OS transistor included in the memory cell MC can have favorable switching characteristics as well as a low off-state current.

The OS transistor included in the memory cell MC is formed on an insulating surface; thus, unlike in a Si transistor using a semiconductor substrate as a channel formation region, parasitic capacitance is not generated between a gate electrode and a semiconductor substrate. Consequently, with the use of the OS transistor, carriers can be controlled easily with a gate electric field, and favorable switching characteristics are obtained.

<Oxide Semiconductor>

Next, an oxide semiconductor that can be used for a semiconductor layer of the OS transistor will be described.

An oxide semiconductor used for a channel formation region in the semiconductor layer of the transistor preferably contains at least indium (In) or zinc (Zn). In particular, the oxide semiconductor preferably contains both In and Zn. The oxide semiconductor preferably contains a stabilizer for strongly bonding oxygen, in addition to In and Zn. As a stabilizer, at least one of gallium (Ga), tin (Sn), zirconium (Zr), hafnium (Hf), and aluminum (Al) is contained.

As another stabilizer, the oxide semiconductor may contain one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor used for the semiconductor layer of the transistor, any of the following can be used, for example: indium oxide, tin oxide, zinc oxide, In—Zn-based oxide, Sn—Zn-based oxide, Al—Zn-based oxide, Zn—Mg-based oxide, Sn—Mg-based oxide, In—Mg-based oxide, In—Ga-based oxide, In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—Zr—Zn-based oxide, In—Ti—Zn-based oxide, In—Sc—Zn-based oxide, In—Y—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

For example, it is possible to use an In—Ga—Zn-based oxide with an atomic ratio of In:Ga:Zn=1:1:1, 3:1:2, or 2:1:3 or an oxide with an atomic ratio close to the above atomic ratios.

If an oxide semiconductor film forming the semiconductor layer contains a large amount of hydrogen, the hydrogen and the oxide semiconductor are bonded to each other, so that part of the hydrogen serves as a donor and causes generation of an electron which is a carrier. As a result, the threshold voltage of the transistor shifts in the negative direction. It is therefore preferable that after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is sometimes reduced by the dehydration treatment (dehydrogenation treatment). For this reason, it is preferable that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment. Moreover, treatment for making the oxygen content of an oxide semiconductor film be in excess of that in the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) oxide semiconductor film or a substantially i-type (intrinsic) oxide semiconductor film that is extremely close to an i-type oxide semiconductor film. Note that "substantially intrinsic" means that the oxide semiconductor film contains extremely few (close to zero) carriers derived from a donor and has a carrier density of $1\times10^{17}/cm^3$ or lower, $1\times10^{16}/cm^3$ or lower, $1\times10^{15}/cm^3$ or lower, $1\times10^{14}/cm^3$ or lower, or $1\times10^{13}/cm^3$ or lower.

The transistor including an i-type or substantially i-type oxide semiconductor film can have extremely favorable off-state current characteristics.

A structure of the oxide semiconductor film is described below.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is an oxide semiconductor film having a plurality of c-axis aligned crystal parts.

When a combined analysis image (also referred to as high-resolution TEM image) of a bright-field image and a diffraction pattern of the CAAC-OS film is observed with a transmission electron microscope (TEM), a plurality of crystal parts are observed. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to the sample surface, metal atoms are arranged in a layered manner in the crystal parts. Each metal atom layer reflects unevenness of a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

According to the high-resolution plan-view TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

Figure 9A:
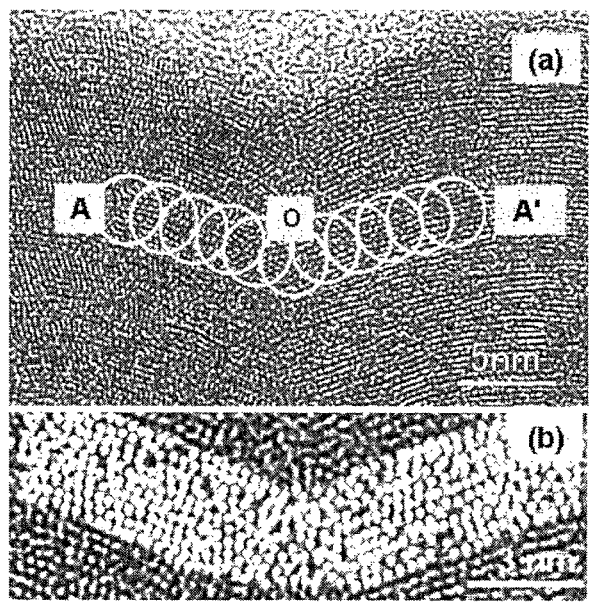
FIGS. 9A and 9B are high-resolution cross-sectional TEM images of an oxide semiconductor.
Figure 9B:

FIG. 9A is a high-resolution cross-sectional TEM image of a CAAC-OS film. FIG. 9B is a high-resolution cross-sectional TEM image obtained by enlarging the image of FIG. 9A. In FIG. 9B, atomic arrangement is highlighted for easy understanding.

Figure 9C:
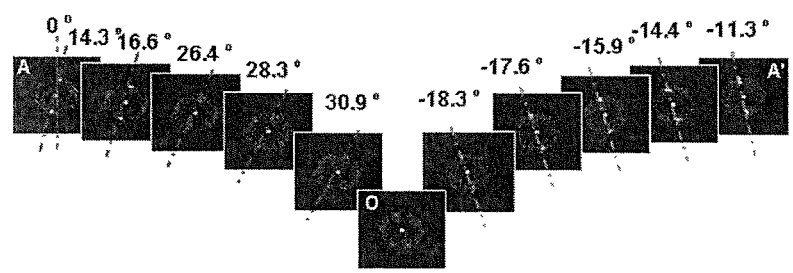
FIG. 9C shows local Fourier transform images of the oxide semiconductor.

FIG. 9C is Fourier transform images of regions each surrounded by a circle (with a diameter of approximately 4 nm) between A and O and between O and A' in FIG. 9A. C-axis alignment can be observed in each region in FIG. 9C. The c-axis direction between A and O is different from that between O and A', which indicates that a grain in the region between A and O is different from that between O and A'. In addition, between A and O, the angle of the c-axis changes gradually and continuously from 14.3° to 16.6° to 26.4°. Similarly, between O and A', the angle of the c-axis changes gradually and continuously from −18.3° to −17.6° to −15.90.

In an electron diffraction pattern of the CAAC-OS film, spots (bright spots) indicating alignment are shown. For example, when electron diffraction with an electron beam having a diameter of 1 nm to 30 nm (such electron diffraction is also referred to as nanobeam electron diffraction) is performed on the top surface of the CAAC-OS film, spots are observed (see FIG. 10A).

From the results of the high-resolution cross-sectional TEM image and the high-resolution plan-view TEM image, alignment is found in the crystal parts of the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 nm$^2$ or more, 5 μm$^2$ or more, or 1000 μm$^2$ or more is observed in some cases in the high-resolution plan-view TEM image.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently at a diffraction angle (2θ) of around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently at 2θ of around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed when φ scan is performed with 2θ fixed at around 56°.

According to the above results, in the CAAC-OS film, while the directions of a-axes and b-axes are irregularly oriented between crystal parts, the c-axes are aligned in a direction parallel to a normal vector of a formation surface or a normal vector of a top surface. Thus, each metal atom layer arranged in a layered manner observed in the high-resolution cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, when the shape of the CAAC-OS film is changed by etching or the like, the c-axis of the crystal might not be necessarily parallel to a normal vector of a formation surface or a normal vector of a top surface of the CAAC-OS film.

Furthermore, distribution of c-axis aligned crystal parts in the CAAC-OS film is not necessarily uniform. For example, in the case where crystal growth leading to the CAAC-OS film occurs from the vicinity of the top surface of the film, the crystallinity in the vicinity of the top surface is higher than that in the vicinity of the formation surface in some cases. Moreover, when an impurity is added to the CAAC-OS film, a region to which the impurity is added is altered, and the proportion of the c-axis aligned crystal parts in the CAAC-OS film sometimes varies depending on regions.

When the CAAC-OS film with an InGaZnO$_4$ crystal is analyzed by an out-of-plane method, a peak may also be observed at 2θ of around 36° as well as at 2θ of around 31°. The peak at 2θ of around 36° indicates that a crystal having no c-axis alignment is included in part of the CAAC-OS film. It is preferable that in the CAAC-OS film, a peak appear at 2θ of around 31° and a peak not appear at 2θ of around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. A heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. The impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which the impurity concentration is low and the density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Consequently, a transistor including such an oxide semiconductor film rarely has negative threshold voltage (rarely has normally-on characteristics). The highly purified intrinsic or substantially highly purified intrinsic oxide semiconductor film has few carrier traps; therefore, the transistor including the oxide semiconductor film has little variation in electrical characteristics and high reliability. Electric charge trapped by the carrier traps in the oxide semiconductor film takes a long time to be released and might behave like fixed electric charge. Thus, the transistor including an oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a polycrystalline oxide semiconductor film is described.

In a high-resolution TEM image of the polycrystalline oxide semiconductor film, crystal grains are observed. In most cases, the crystal grain size in the polycrystalline oxide semiconductor film ranges from 2 nm to 300 nm, from 3 nm to 100 nm, or from 5 nm to 50 nm in the high-resolution TEM image, for example. Moreover, in the high-resolution TEM image of the polycrystalline oxide semiconductor film, a grain boundary may be observed.

The polycrystalline oxide semiconductor film may include a plurality of crystal grains, and alignment of crystals may be different in the plurality of crystal grains. A polycrystalline oxide semiconductor film is subjected to structural analysis with an XRD apparatus. For example, when the polycrystalline oxide semiconductor film including an $InGaZnO_4$ crystal is analyzed by an out-of-plane method, peaks sometimes appear at $2\theta$ of around 31°□□036°, and the like.

The polycrystalline oxide semiconductor film has high crystallinity and thus has high electron mobility in some cases. Accordingly, a transistor including the polycrystalline oxide semiconductor film has high field-effect mobility. Note that in the polycrystalline oxide semiconductor film, an impurity is sometimes segregated at a grain boundary. Moreover, the grain boundary of the polycrystalline oxide semiconductor film becomes a defect state. Since the grain boundary of the polycrystalline oxide semiconductor film may serve as a carrier trap or a carrier generation source, a transistor including the polycrystalline oxide semiconductor film may have larger variation in electrical characteristics and lower reliability than a transistor including a CAAC-OS film.

Next, a microcrystalline oxide semiconductor film is described.

In a high-resolution TEM image of a microcrystalline oxide semiconductor film, there are a region where a crystal part is observed and a region where a crystal part is not clearly observed. In most cases, a crystal part in the microcrystalline oxide semiconductor film ranges from 1 nm to 100 nm or from 1 nm to 10 nm. A microcrystal with a size in the range of 1 nm to 10 nm or of 1 nm to 3 nm is specifically referred to as nanocrystal (nc). An oxide semiconductor film including nanocrystal is referred to as a nanocrystalline oxide semiconductor (nc-OS) film. In a high-resolution TEM image of the nc-OS film, a grain boundary cannot be found clearly in some cases.

In the nc-OS film, a microscopic region (e.g., a region with a size ranging from 1 nm to 10 nm, in particular, from 1 nm to 3 nm) has a periodic atomic order. There is no regularity of crystal orientation between different crystal parts in the nc-OS film; thus, the orientation of the whole film is not observed. Consequently, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak showing a crystal plane does not appear. A diffraction pattern like a halo pattern appears in a selected-area electron diffraction pattern of the nc-OS film obtained by using an electron beam having a probe diameter larger than the diameter of a crystal part (e.g., having a probe diameter of 50 nm or larger). Meanwhile, spots are shown in a nanobeam electron diffraction pattern of the nc-OS film obtained by using an electron beam having a probe diameter close to or smaller than the diameter of a crystal part. Furthermore, in a nanobeam electron diffraction pattern of the nc-OS film, regions with high luminance in a circular (ring) pattern are sometimes shown. Also in a nanobeam electron diffraction pattern of the nc-OS film, a plurality of spots are sometimes shown in a ring-like region (see FIG. 10B).

The nc-OS film is an oxide semiconductor film that has higher regularity than an amorphous oxide semiconductor film, and therefore has a lower density of defect states than an amorphous oxide semiconductor film. However, there is no regularity of crystal orientation between different crystal parts in the nc-OS film; hence, the nc-OS film has a higher density of defect states than the CAAC-OS film.

Consequently, the nc-OS film may have a higher carrier density than the CAAC-OS film. The oxide semiconductor film with a high carrier density may have high electron mobility. Thus, a transistor including the nc-OS film may have high field-effect mobility. Furthermore, the nc-OS film has a higher defect state density than the CAAC-OS film, and thus may have a large number of carrier traps. Consequently, a transistor including the nc-OS film has larger variation in electrical characteristics and lower reliability than a transistor including the CAAC-OS film. Note that the nc-OS film can be formed easily as compared to the CAAC-OS film because nc-OS film can be formed even when a relatively large amount of impurities are included; thus, depending on the purpose, the nc-OS film can be favorably used in some cases. Therefore, a semiconductor device using the transistor including the nc-OS film can be manufactured with high productivity in some cases.

Next, an amorphous oxide semiconductor film is described.

The amorphous oxide semiconductor film has disordered atomic arrangement and no crystal part. An example of the amorphous oxide semiconductor film is an oxide semiconductor film with a non-crystalline state like quartz glass.

In a high-resolution TEM image of the amorphous oxide semiconductor film, crystal parts cannot be found.

When the amorphous oxide semiconductor film is subjected to structural analysis by an out-of-plane method with an XRD apparatus, a peak showing a crystal plane does not appear. A halo pattern is shown in an electron diffraction pattern of the amorphous oxide semiconductor film. Furthermore, a halo pattern is shown but a spot is not shown in a nanobeam electron diffraction pattern of the amorphous oxide semiconductor film.

The amorphous oxide semiconductor film is an oxide semiconductor film that contains impurities such as hydrogen at a high concentration and has a high density of defect states.

The oxide semiconductor film with a high impurity concentration and a high density of defect states has a large number of carrier traps or carrier generation sources.

Accordingly, the amorphous oxide semiconductor film has a much higher carrier density than the nc-OS film in some cases. Therefore, a transistor including the amorphous oxide semiconductor film tends to have normally-on characteristics; thus, in some cases, the amorphous oxide semiconductor layer can be used for a transistor that needs to be normally on. Since the amorphous oxide semiconductor film has a high density of defect states, carrier traps might be increased. Consequently, a transistor including the amorphous oxide semiconductor film has larger variation in electrical characteristics and lower reliability than a transistor including the CAAC-OS film or the nc-OS film.

Next, a single-crystal oxide semiconductor film is described.

The single-crystal oxide semiconductor film has a low impurity concentration and a low density of defect states (few oxygen vacancies), and thus has a low carrier density. Accordingly, a transistor including the single-crystal oxide semiconductor film is unlikely to have normally-on characteristics. Moreover, since the single-crystal oxide semiconductor film has a low impurity concentration and a low density of defect states, carrier traps might be reduced. Thus, the transistor including the single-crystal oxide semiconductor film has small variation in electrical characteristics and accordingly has high reliability.

Note that when the oxide semiconductor film has few defects, the density thereof is increased. When the oxide semiconductor film has high crystallinity, the density thereof is increased. When the oxide semiconductor film has a lower concentration of impurities such as hydrogen, the density thereof is increased. The single-crystal oxide semiconductor film has a higher density than the CAAC-OS film. The CAAC-OS film has a higher density than the microcrystalline oxide semiconductor film. The polycrystalline oxide semiconductor film has a higher density than the microcrystalline oxide semiconductor film. The microcrystalline oxide semiconductor film has a higher density than the amorphous oxide semiconductor film.

Note that an oxide semiconductor film may have a structure having physical properties intermediate between the nc-OS film and the amorphous oxide semiconductor film. The oxide semiconductor film having such a structure is specifically referred to as an amorphous-like oxide semiconductor (amorphous-like OS) film.

In a high-resolution TEM image of the amorphous-like OS film, a void may be seen. Furthermore, in the high-resolution TEM image, there are a region where a crystal part is clearly observed and a region where a crystal part is not observed. In the amorphous-like OS film, crystallization by a slight amount of electron beam used for TEM observation occurs and growth of the crystal part is found in some cases. In contrast, crystallization by a slight amount of electron beam used for TEM observation is less observed in the nc-OS film having good quality.

The crystal part size in the amorphous-like OS film and the nc-OS film can be measured using high-resolution TEM images. For example, an InGaZnO$_4$ crystal has a layered structure in which two Ga—Zn—O layers are included between In—O layers. A unit cell of the InGaZnO$_4$ crystal has a structure in which nine layers of three In—O layers and six Ga—Zn—O layers are layered in the c-axis direction. Accordingly, the spacing between these adjacent layers is equivalent to the lattice spacing (also referred to as d value) on the (009) plane. The value is calculated to 0.29 nm from crystal structure analysis. Thus, each of the lattice fringes in which the spacing therebetween is from 0.28 nm to 0.30 nm is regarded to correspond to the a-b plane of the InGaZnO$_4$ crystal, focusing on the lattice fringes in the high-resolution TEM image. The maximum length in the region in which the lattice fringes are observed is regarded as the size of crystal part of the amorphous-like OS film and the nc-OS film. Note that the crystal part whose size is 0.8 nm or larger is selectively evaluated.

Figure 11:
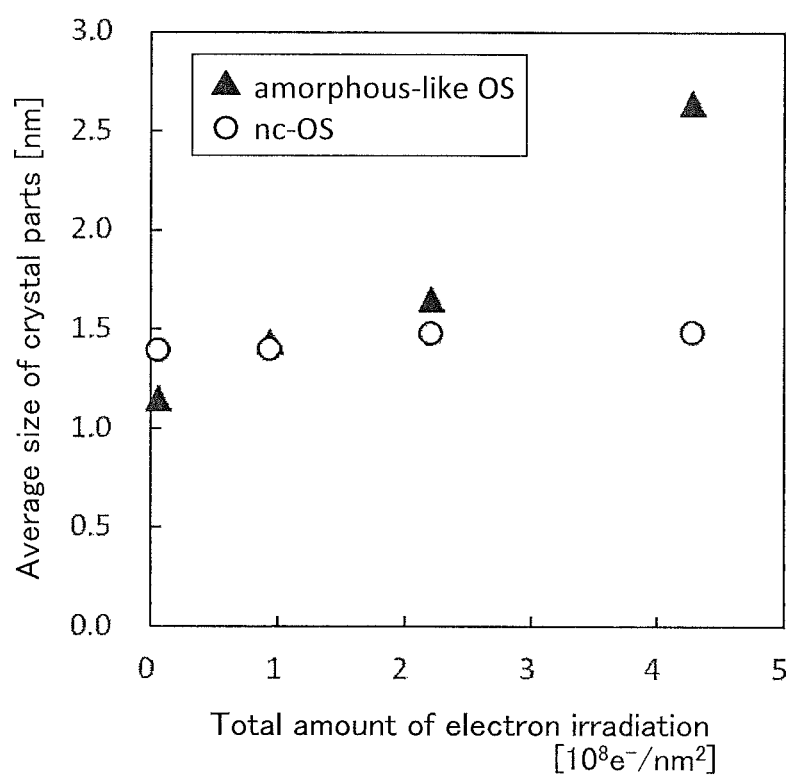
FIG. 11 shows a change in crystal parts by electron irradiation.

FIG. 11 shows examination results of change in average size of crystal parts (20 to 40 points) in the amorphous-like OS film and the nc-OS film using high-resolution TEM images. From FIG. 11, the crystal part size in the amorphous-like OS film increases with an increase of the total amount of electron irradiation. Specifically, the crystal part of approximately 1.2 nm at the start of TEM observation grows to a size of approximately 2.6 nm at the total amount of electron irradiation of $4.2 \times 10^8$ e$^-$/nm$^2$. In contrast, the crystal part size in the good-quality nc-OS film shows little change from the start of electron irradiation to the total amount of electron irradiation of $4.2 \times 10^8$ e$^-$/nm$^2$ regardless of the amount of electron irradiation.

Furthermore, in FIG. 11, by linear approximation of the change in the crystal part size in the amorphous-like OS film and the nc-OS film and extrapolation to the total amount of electron irradiation of 0 e$^-$/nm$^2$, the average size of the crystal part is found to be a positive value. This means that the crystal parts exist in the amorphous-like OS film and the nc-OS film before TEM observation.

Note that an oxide semiconductor film may be a stacked film including two or more kinds of an amorphous oxide semiconductor film, a microcrystalline oxide semiconductor film, and a CAAC-OS film, for example.

In the case where the oxide semiconductor film has a plurality of structures, the structures can be analyzed using nanobeam electron diffraction in some cases.

Figure 10A:
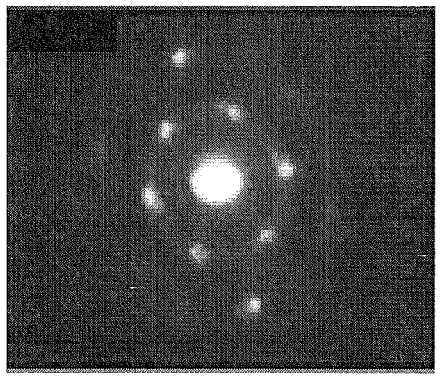
FIGS. 10A and 10B show nanobeam electron diffraction patterns of oxide semiconductor films.
Figure 10B:
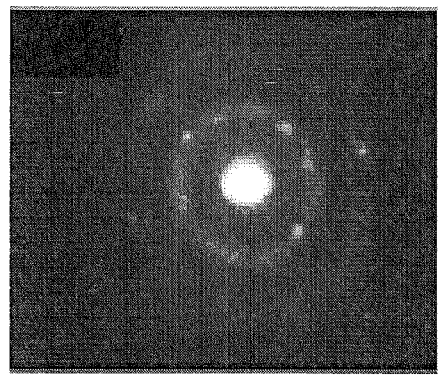
Figure 10C:
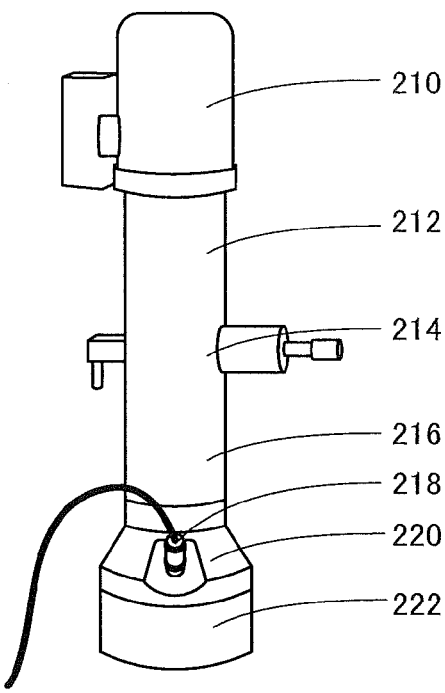
FIGS. 10C and 10D illustrate an example of a transmission electron diffraction measurement apparatus.

FIG. 10C illustrates a transmission electron diffraction measurement apparatus that includes an electron gun chamber 210, an optical system 212 below the electron gun chamber 210, a sample chamber 214 below the optical system 212, an optical system 216 below the sample chamber 214, an observation chamber 220 below the optical system 216, a camera 218 installed in the observation chamber 220, and a film chamber 222 below the observation chamber 220. The camera 218 is provided to face toward the inside of the observation chamber 220. Note that the film chamber 222 is not necessarily provided.

Figure 10D:
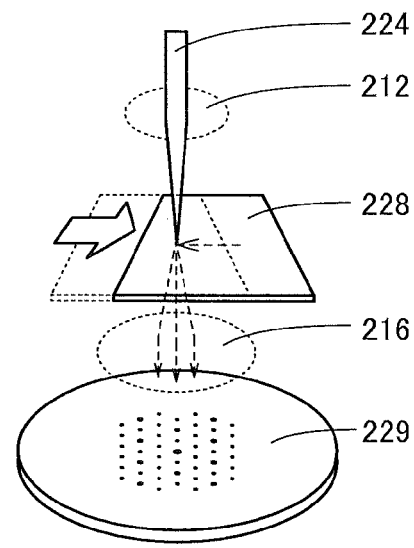

FIG. 10D illustrates the internal structure of the transmission electron diffraction measurement apparatus in FIG. 10C. In the transmission electron diffraction measurement apparatus, a substance 228 that is positioned in the sample chamber 214 is irradiated with electrons emitted from an electron gun installed in the electron gun chamber 210 through the optical system 212. Electrons passing through the substance 228 are incident on a fluorescent plate 229 provided in the observation chamber 220 through the optical system 216. On the fluorescent plate 229, a pattern corresponding to the intensity of the incident electrons appears, which allows measurement of a transmission electron diffraction pattern.

The camera 218 is installed so as to face the fluorescent plate 229 and can take an image of a pattern appearing on the fluorescent plate 229. An angle formed by a straight line that passes through the center of a lens of the camera 218 and the center of the fluorescent plate 229 and an upper surface of the fluorescent plate 229 ranges, for example, from 15° to 80°, from 30° to 75°, or from 45° to 70°. As the angle becomes smaller, distortion of the transmission electron diffraction pattern taken by the camera 218 becomes larger. Note that if the angle is obtained in advance, the distortion of an obtained transmission electron diffraction pattern can be corrected. Note that the film chamber 222 may be provided with the camera 218. For example, the camera 218 may be set in the film chamber 222 so as to be opposite to the incident direction of electrons 224. In this case, a transmission electron diffraction pattern with less distortion can be taken from the rear surface of the fluorescent plate 229.

A holder for fixing the substance 228 that is a sample is provided in the sample chamber 214. The holder transmits electrons passing through the substance 228. The holder may have, for example, a function of moving the substance 228 in the direction of the X, Y, and Z axes. The movement function of the holder may have an accuracy of moving the substance in the range of, for example, 1 nm to 10 nm, 5 nm to 50 nm, 10 nm to 100 nm, 50 nm to 500 nm, and 100 nm to 1 μm. The range is preferably determined to be an optimal range for the structure of the substance 228.

Then, a method for measuring a transmission electron diffraction pattern of a substance by the transmission electron diffraction measurement apparatus described above will be described.

For example, changes in the structure of a substance can be observed by changing the irradiation position of the electrons 224 that are a nanobeam on the substance (or by scanning) as illustrated in FIG. 10D. At this time, when the substance 228 is a CAAC-OS film, a diffraction pattern such as one shown in FIG. 10A is observed. When the substance 228 is an nc-OS film, a diffraction pattern such as one shown in FIG. 10B is observed.

Even when the substance 228 is a CAAC-OS film, a diffraction pattern similar to that of an nc-OS film or the like is partly observed in some cases. Therefore, the quality of a CAAC-OS film can be sometimes represented by the proportion of a region where a diffraction pattern of a CAAC-OS film is observed in a predetermined area (also referred to as proportion of CAAC (c-axis aligned crystal)). In a high-quality CAAC-OS film, for example, the proportion of CAAC is 50% or higher, preferably 80% or higher, further preferably 90% or higher, still further preferably 95% □ or higher. Note that a region where a diffraction pattern different from that of a CAAC-OS film is observed is referred to as the proportion of non-CAAC.

For example, transmission electron diffraction patterns were obtained by scanning a top surface of a sample including a CAAC-OS film obtained just after deposition (represented as "as-sputtered") and a top surface of a sample including a CAAC-OS film subjected to heat treatment at 450° C. in an atmosphere containing oxygen. Here, the proportion of CAAC was obtained in such a manner that diffraction patterns were observed by scanning for 60 seconds at a rate of 5 nm/s and the obtained diffraction patterns were converted into still images every 0.5 seconds. As an electron beam, a nanobeam with a probe diameter of 1 nm was used. The above measurement was performed on six samples. The proportion of CAAC was calculated using the average value of the six samples.

Figure 12A:
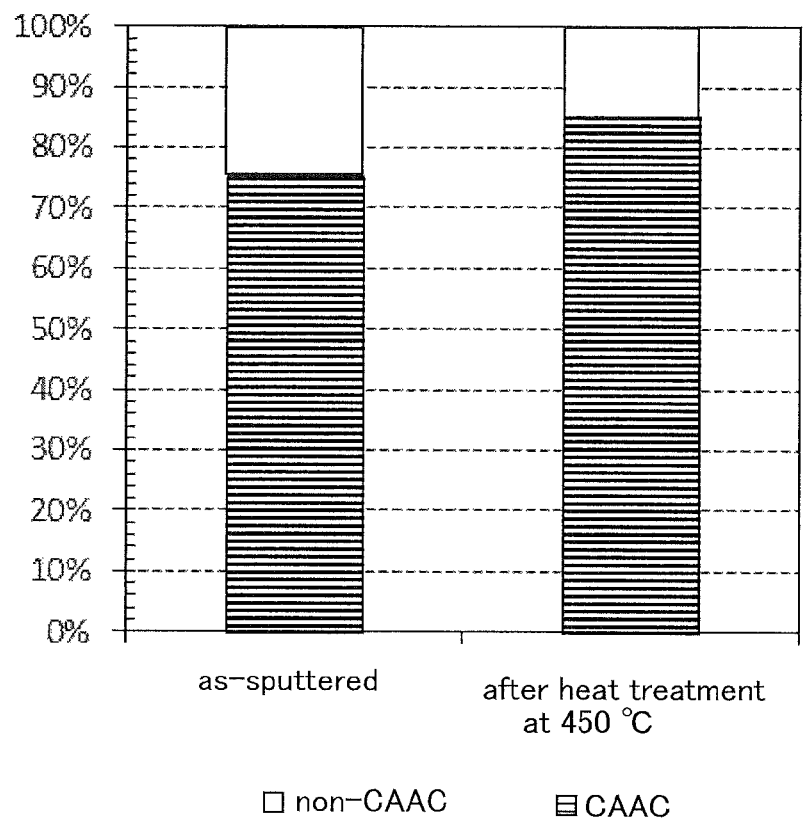
FIG. 12A shows an example of structural analysis by transmission electron diffraction measurement.

FIG. 12A shows the proportion of CAAC in each sample. The proportion of CAAC of the as-sputtered CAAC-OS film was 75.7% (the proportion of non-CAAC was 24.3%). The proportion of CAAC of the CAAC-OS film subjected to the heat treatment at 450° C. was 85.3% (the proportion of non-CAAC was 14.7%). These results show that the proportion of CAAC obtained after the heat treatment at 450° C. is higher than that obtained just after the deposition. That is, heat treatment at a high temperature (e.g., 400° C. or higher) reduces the proportion of non-CAAC (increases the proportion of CAAC). The above results also indicate that the CAAC-OS film can have a high proportion of CAAC even when the temperature of the heat treatment is lower than 500° C.

Here, most of diffraction patterns different from that of a CAAC-OS film were similar to that of an nc-OS film. Furthermore, an amorphous oxide semiconductor film was not observed in the measurement region. Therefore, the above results suggest that the region having a structure similar to that of an nc-OS film is rearranged by heat treatment owing to the influence of the structure of the adjacent region, whereby the region becomes CAAC.

Figure 12B:
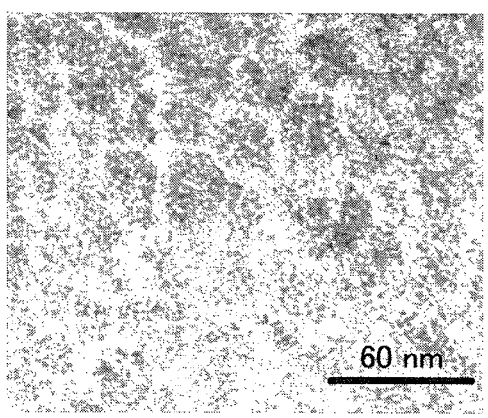
FIGS. 12B and 12C are high-resolution plan-view TEM images.
Figure 12C:
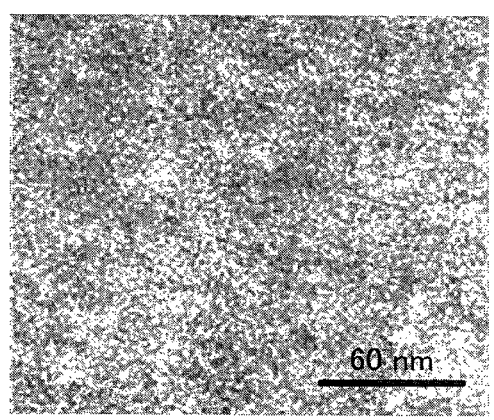

FIGS. 12B and 12C are high-resolution plan-view TEM images of the as-sputtered CAAC-OS film and the CAAC-OS film subjected to the heat treatment at 450° C., respectively. Comparison between FIGS. 12B and 12C shows that the CAAC-OS film subjected to the heat treatment at 450° C. has more uniform film quality. That is, heat treatment at a high temperature improves the film quality of the CAAC-OS film.

With such a measurement method, the structure of an oxide semiconductor film having a plurality of structures can be analyzed in some cases.

Note that the structures, methods, and the like described in this embodiment can be used as appropriate in combination with any of the structures, methods, and the like described in the other embodiments.

(Embodiment 4)

In this embodiment, examples of a layout diagram of the memory cell MC, and a circuit diagram and a schematic cross-sectional view corresponding to the layout diagram will be described with reference to FIGS. 13A and 13B and FIG. 14.

Figure 13A:
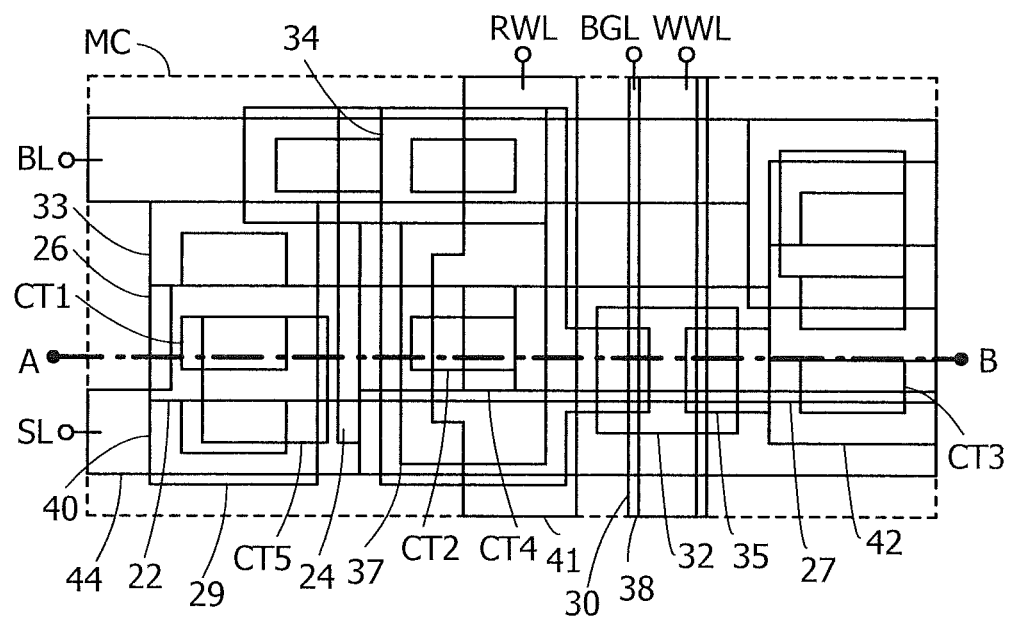
FIGS. 13A and 13B are a layout diagram and a circuit diagram for illustrating one embodiment of the present invention.

FIG. 13A is a layout diagram of the memory cell MC. FIG. 13B is a circuit diagram corresponding to the layout diagram of FIG. 13A. The circuit diagram of FIG. 13B corresponds to that of FIG. 7B. FIG. 14 is a schematic cross-sectional view along dashed-dotted line A-B in FIG. 13A.

Figure 14:
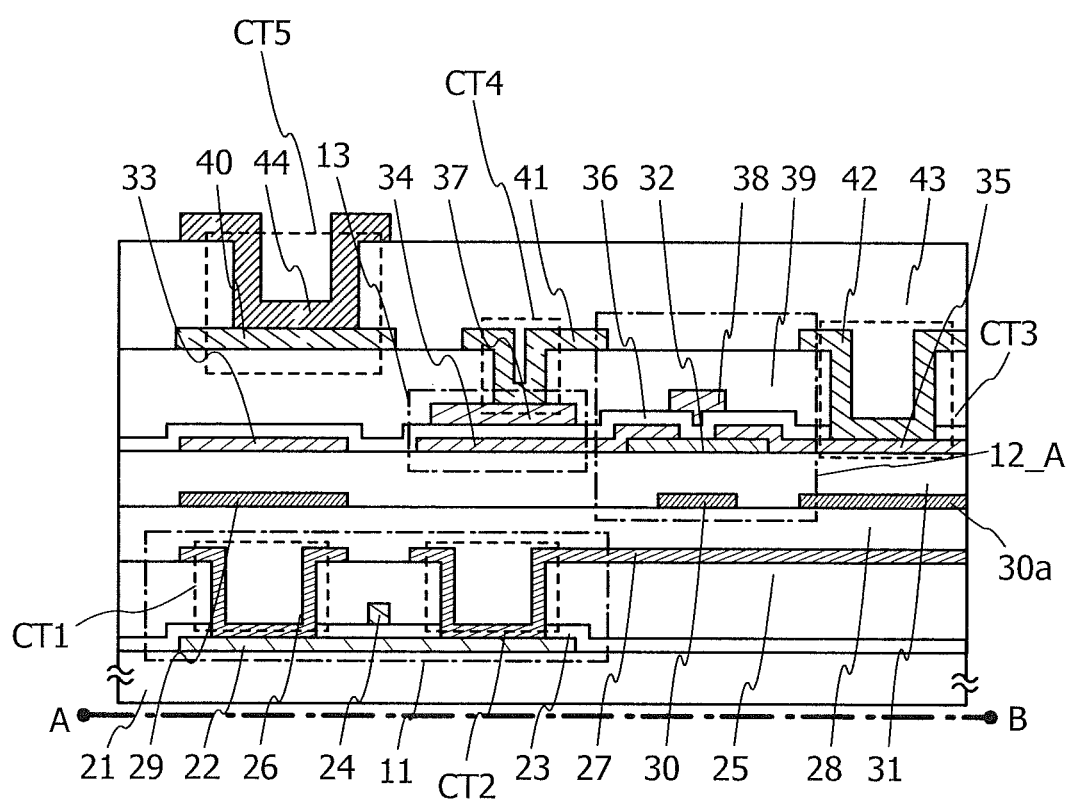
FIG. 14 is a schematic cross-sectional view illustrating one embodiment of the present invention.

FIG. 13A and FIG. 14 illustrate a substrate 21, a semiconductor layer 22, an insulating layer 23, a conductive layer 24, an insulating layer 25, a conductive layer 26, a conductive layer 27, an insulating layer 28, a conductive layer 29, a conductive layer 30, a conductive layer 30a, an insulating layer 31, a semiconductor layer 32, a conductive layer 33, a conductive layer 34, a conductive layer 35, an insulating layer 36, a conductive layer 37, a conductive layer 38, an insulating layer 39, a conductive layer 40, a conductive layer 41, a conductive layer 42, an insulating layer 43, a conductive layer 44, and openings CT1 to CT5.

The substrate 21 can be, for example, a single crystal silicon substrate (including a p-type semiconductor substrate or an n-type semiconductor substrate), a compound semiconductor substrate containing silicon carbide or gallium nitride, a silicon on insulator (SOI) substrate, or a glass substrate.

An amorphous semiconductor, a microcrystalline semiconductor, a polycrystalline semiconductor, or the like can be used for the semiconductor layers 22 and 32. For example, amorphous silicon or microcrystalline germanium can be used. Alternatively, a compound semiconductor such as silicon carbide, gallium arsenide, an oxide semiconductor, or a nitride semiconductor, an organic semiconductor, or the like can be used.

In particular, the semiconductor layer 32 is preferably a single layer or a stacked layer formed using an oxide semiconductor. The oxide semiconductor here refers to an oxide containing at least indium, gallium, and zinc, and can be an In—Ga—Zn-based oxide (also expressed as IGZO). Note that the In—Ga—Zn-based oxide refers to an oxide containing In, Ga, and Zn, and may contain a metal element other than In, Ga, and Zn. For example, it is possible to use an In—Sn—Ga—Zn-based oxide, an In—Hf—Ga—Zn-based oxide, or an In—Al—Ga—Zn-based oxide. The oxide semiconductor can be formed by a sputtering method, an atomic layer deposition (ALD) method, an evaporation method, a coating method, or the like.

A metal material such as aluminum, copper, titanium, tantalum, or tungsten is preferably used for each of the conductive layers 24, 26, 27, 29, 30, 30a, 33, 34, 35, 37, 38, 40, 41, 42, and 44. Alternatively, polycrystalline silicon to which an impurity such as phosphorus is added can be used. As the formation method, a variety of film formation methods such as an evaporation method, a PE-CVD method, a sputtering method, and a spin coating method can be used.

Each of the insulating layers 23, 25, 28, 31, 36, 39, and 43 is preferably a single layer or a multilayer including an inorganic insulating layer or an organic insulating layer. The inorganic insulating layer is preferably a single layer or a multilayer formed using a silicon nitride film, a silicon oxynitride film, a silicon nitride oxide film, or the like. The organic insulating layer is preferably a single layer or a multilayer formed using polyimide, acrylic, or the like. There is no particular limitation on a method for forming each of the insulating layers; for example, a sputtering method, an MBE method, a PE-CVD method, a pulse laser deposition method, or an ALD method can be employed as appropriate.

When an oxide semiconductor is used for the semiconductor layer 32, each of the insulating layers 31 and 36 in contact with the semiconductor layer 32 is preferably a single or multilayer inorganic insulating layer. More preferably, the insulating layers 31 and 36 have an effect of supplying oxygen to the semiconductor layer 32.

The openings CT1 and CT2 are provided in the insulating layers 23 and 25 in order to connect the conductive layers 26 and 27 to the semiconductor layer 22 directly. The opening CT3 is provided in the insulating layers 36 and 39 in order to connect the conductive layer 35 and the conductive layer 42 directly. The opening CT4 is provided in the insulating layer 39 in order to connect the conductive layer 37 and the conductive layer 41 directly. The opening CT5 is provided in the insulating layer 43 in order to connect the conductive layer 40 and the conductive layer 44 directly.

FIGS. 17A to 29B illustrate the order of stacking the conductive layers and the semiconductor layers and forming the openings in the layout diagram of the memory cell MC in FIG. 13A and the schematic cross-sectional view along dashed-dotted line A-B in FIG. 13A.

Figure 17A:
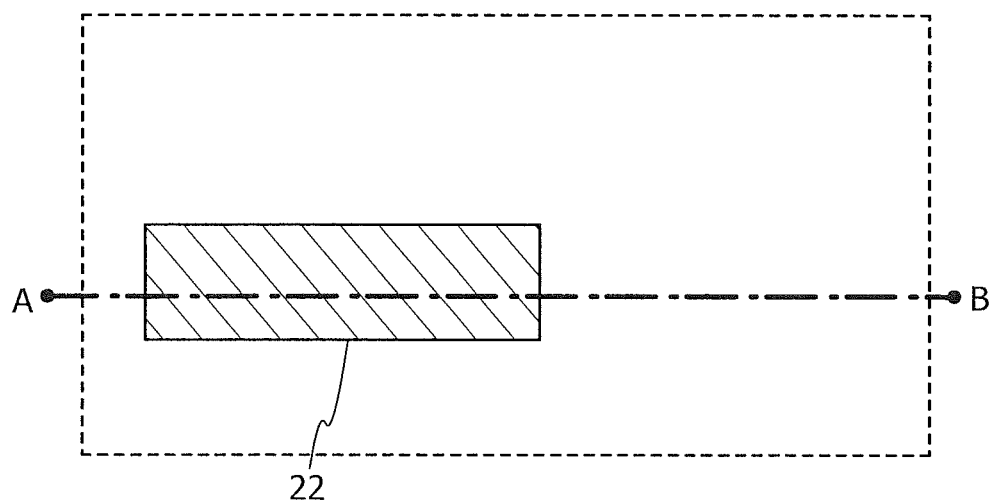
FIGS. 17A and 17B are a layout diagram and a schematic cross-sectional view for illustrating one embodiment of the present invention.
Figure 17B:
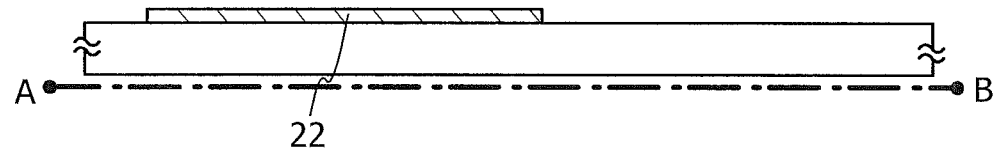

FIGS. 17A and 17B are a layout diagram and a schematic cross-sectional view of the semiconductor layer 22.

Figure 18A:
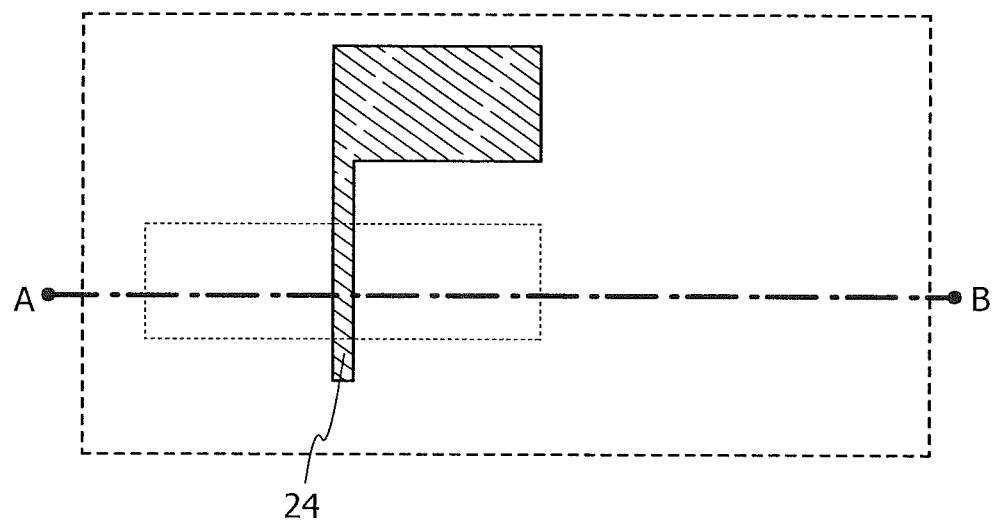
FIGS. 18A and 18B are a layout diagram and a schematic cross-sectional view for illustrating one embodiment of the present invention.
Figure 18B:
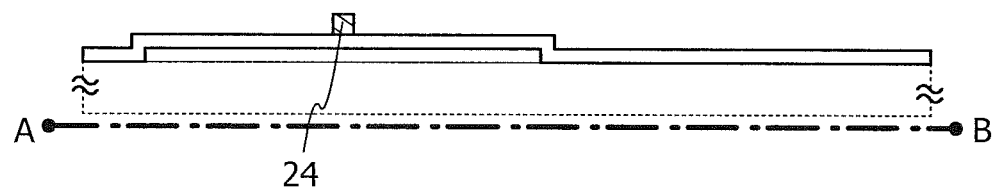

FIGS. 18A and 18B are a layout diagram and a schematic cross-sectional view of the conductive layer 24.

Figure 19A:
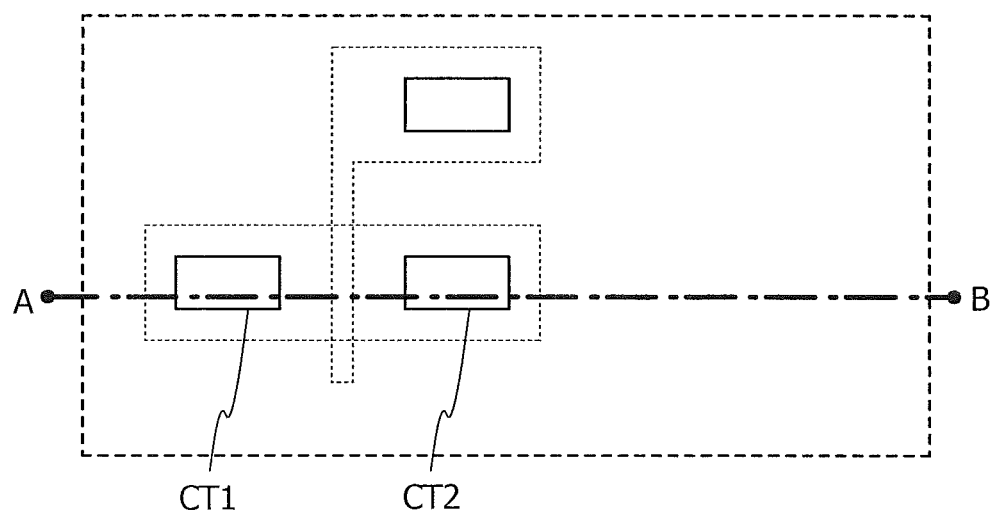
FIGS. 19A and 19B are a layout diagram and a schematic cross-sectional view for illustrating one embodiment of the present invention.
Figure 19B:
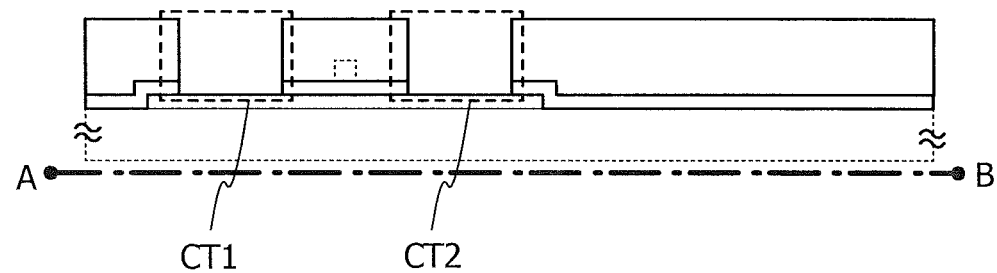

FIGS. 19A and 19B are a layout diagram and a schematic cross-sectional view of the openings CT1 and CT2 and an opening formed at the same level.

Figure 20A:
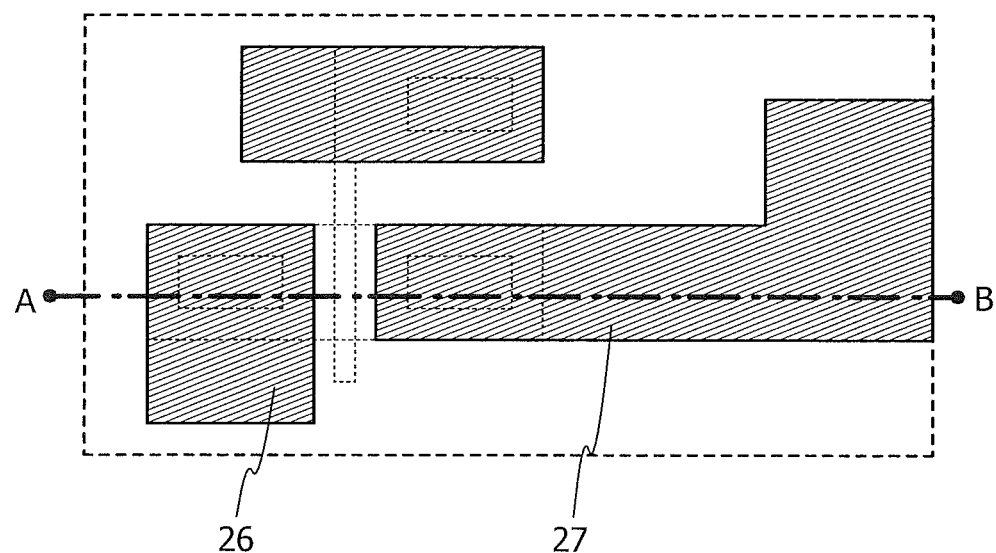
FIGS. 20A and 20B are a layout diagram and a schematic cross-sectional view for illustrating one embodiment of the present invention.
Figure 20B:
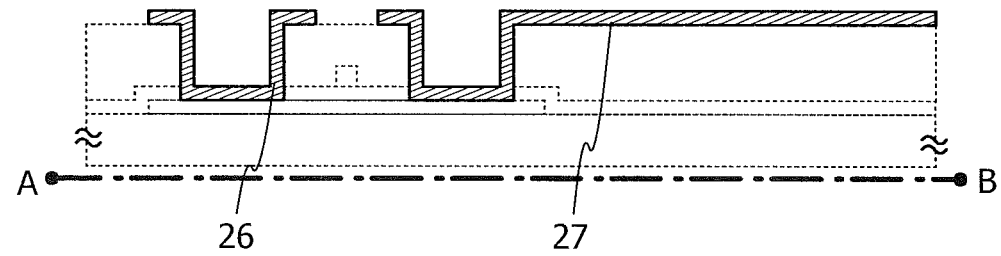

FIGS. 20A and 20B are a layout diagram and a schematic cross-sectional view of the conductive layers 26 and 27 and a conductive layer formed at the same level.

Figure 21A:
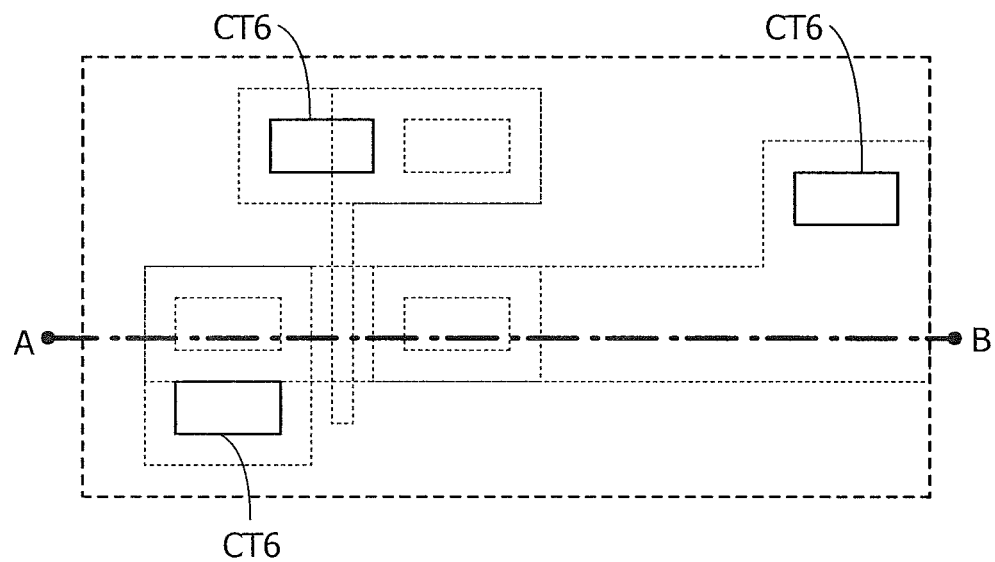
FIGS. 21A and 21B are a layout diagram and a schematic cross-sectional view for illustrating one embodiment of the present invention.
Figure 21B:
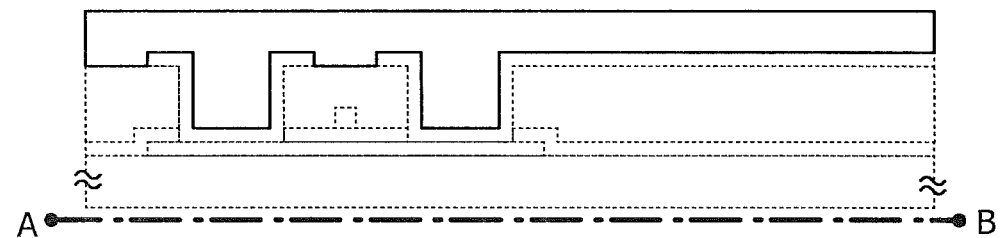

FIGS. 21A and 21B are a layout diagram and a schematic cross-sectional view of openings CT6 for electrically connecting the conductive layers 26 and 27 and the conductive layer formed at one level to the conductive layers 29, 30, and 30a and a conductive layer formed at another level.

Figure 22A:
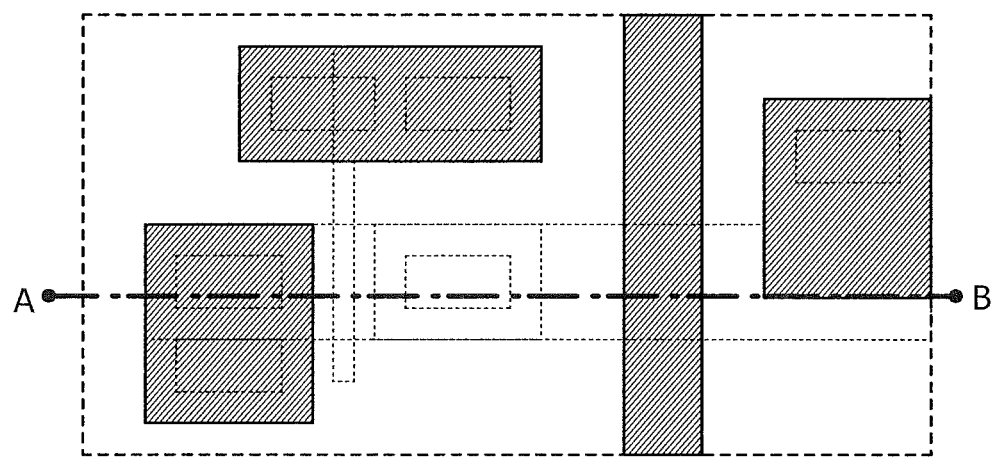
FIGS. 22A and 22B are a layout diagram and a schematic cross-sectional view for illustrating one embodiment of the present invention.
Figure 22B:
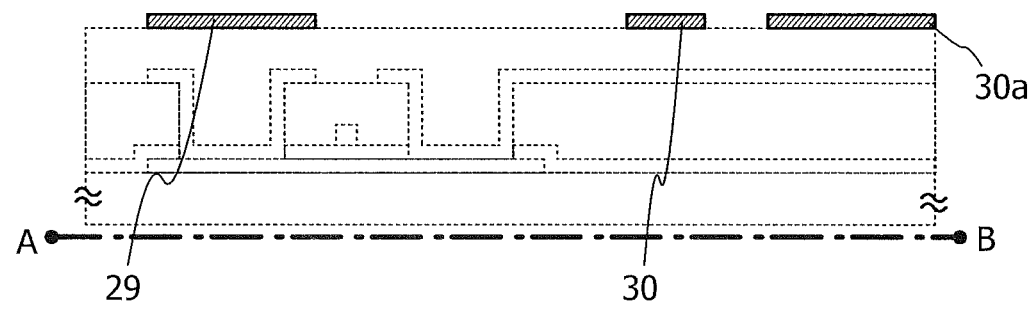

FIGS. 22A and 22B are a layout diagram and a schematic cross-sectional view of the conductive layers 29, 30, and 30a and a conductive layer formed at the same level.

Figure 23A:
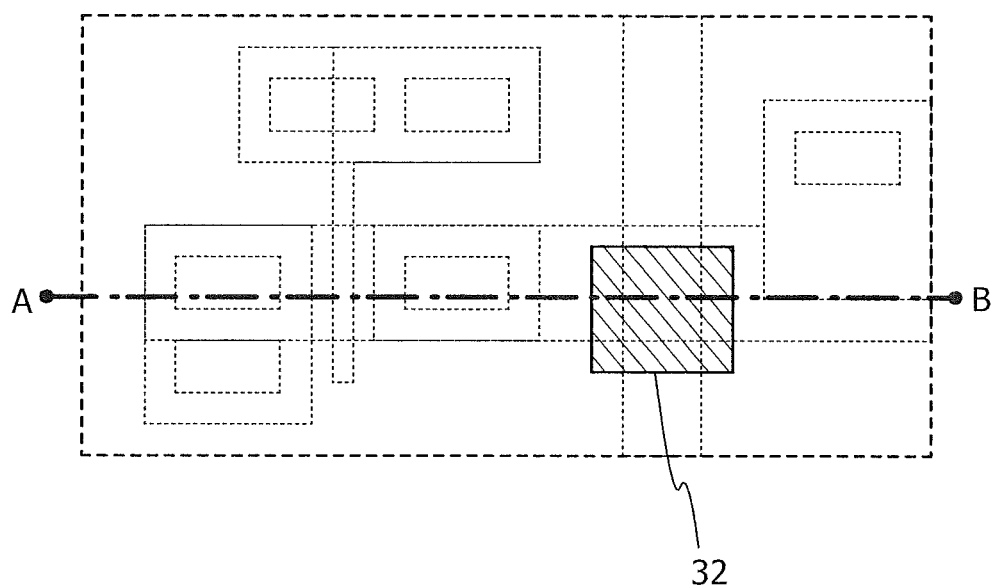
FIGS. 23A and 23B are a layout diagram and a schematic cross-sectional view for illustrating one embodiment of the present invention.
Figure 23B:
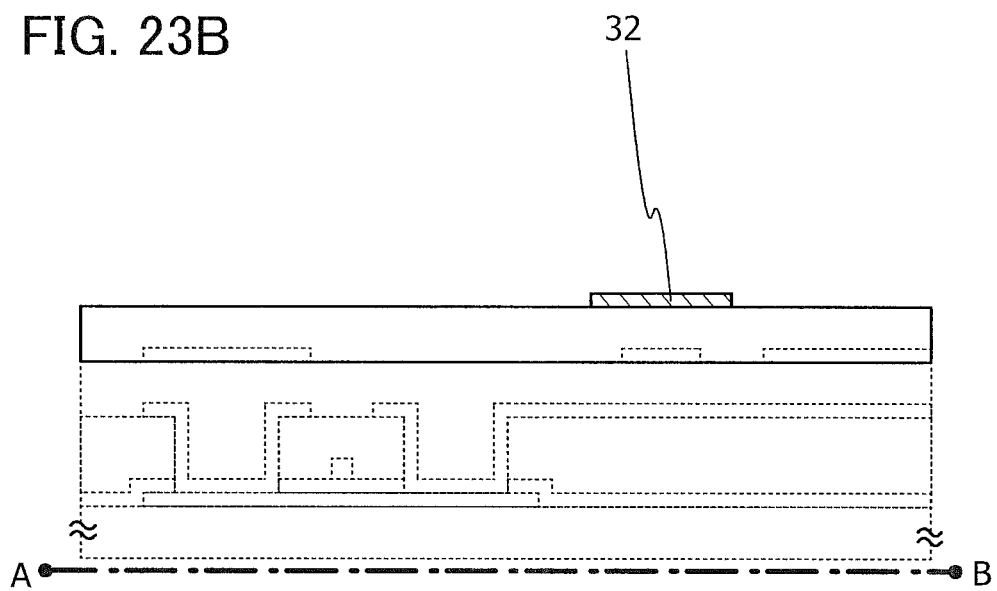

FIGS. 23A and 23B are a layout diagram and a schematic cross-sectional view of the semiconductor layer 32.

Figure 24A:
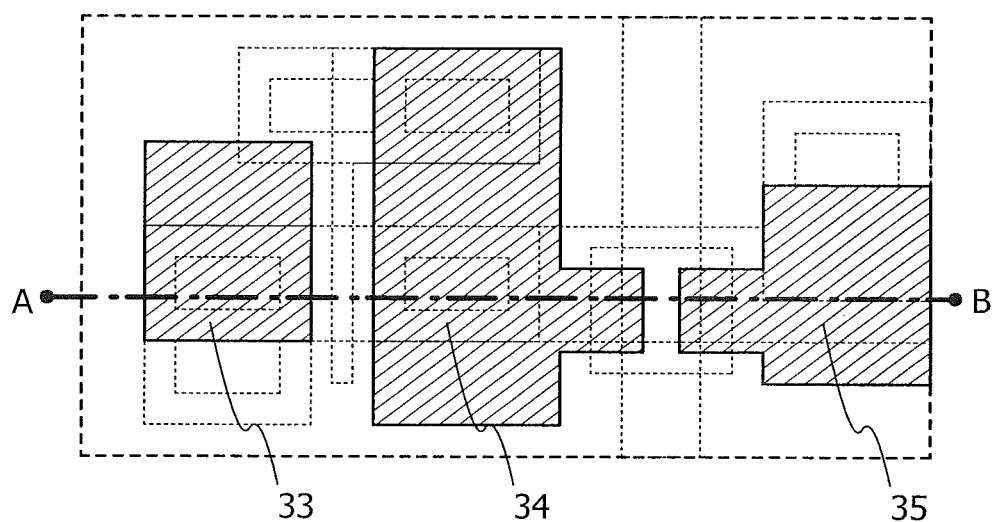
FIGS. 24A and 24B are a layout diagram and a schematic cross-sectional view for illustrating one embodiment of the present invention.
Figure 24B:
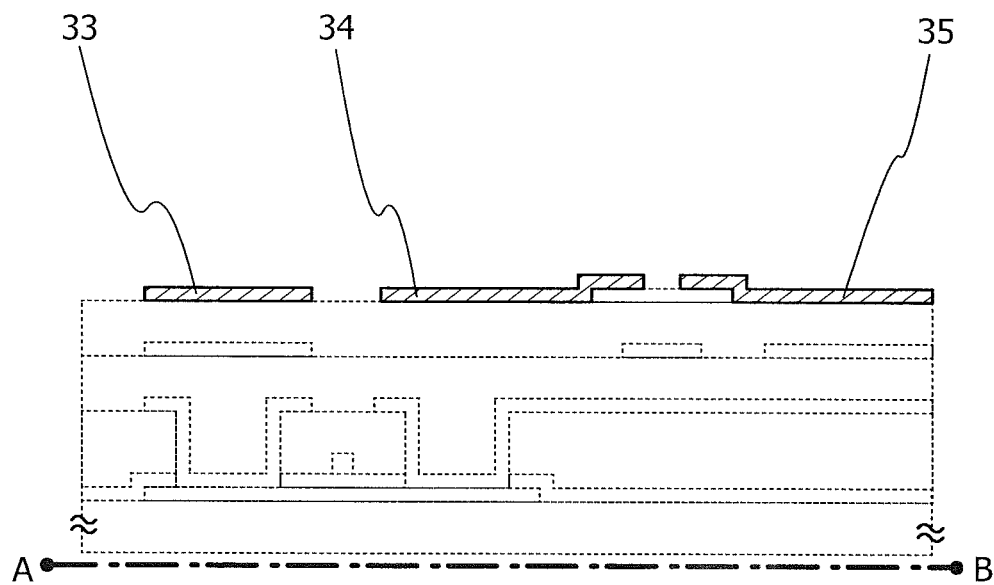

FIGS. 24A and 24B are a layout diagram and a schematic cross-sectional view of the conductive layers 33, 34, and 35.

Figure 25A:
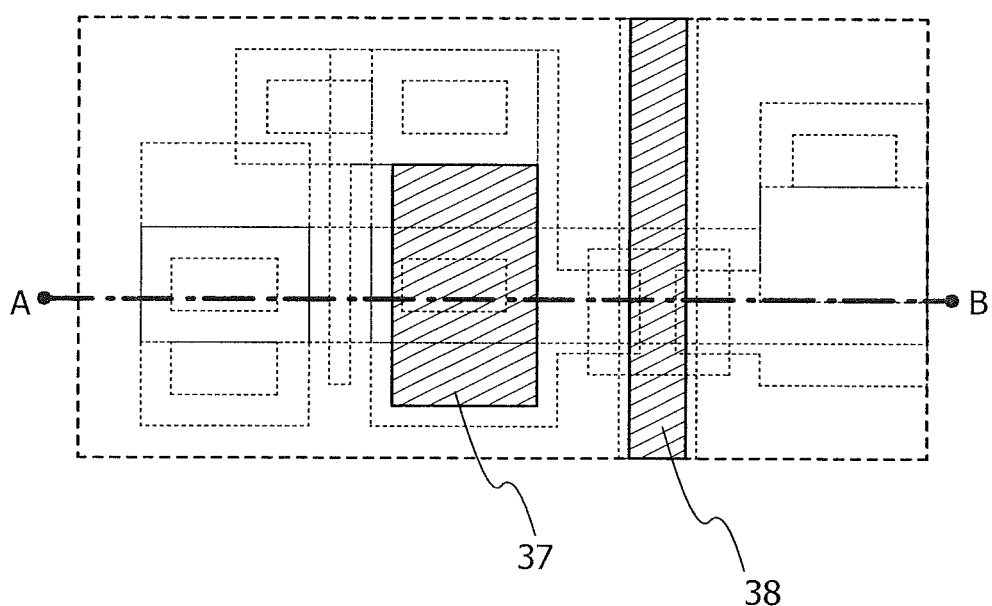
FIGS. 25A and 25B are a layout diagram and a schematic cross-sectional view for illustrating one embodiment of the present invention.
Figure 25B:
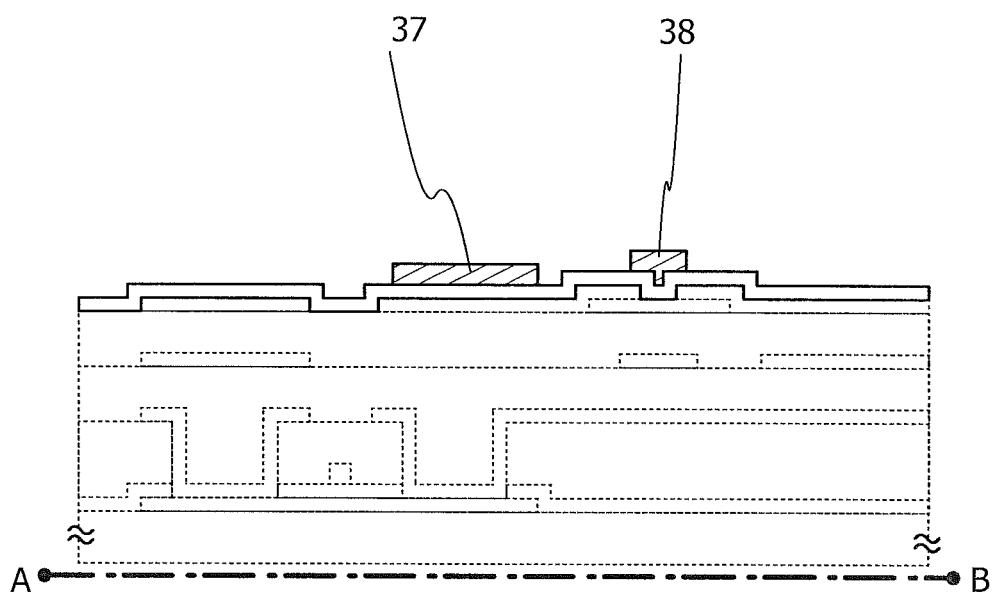

FIGS. 25A and 25B are a layout diagram and a schematic cross-sectional view of the conductive layers 37 and 38.

Figure 26A:
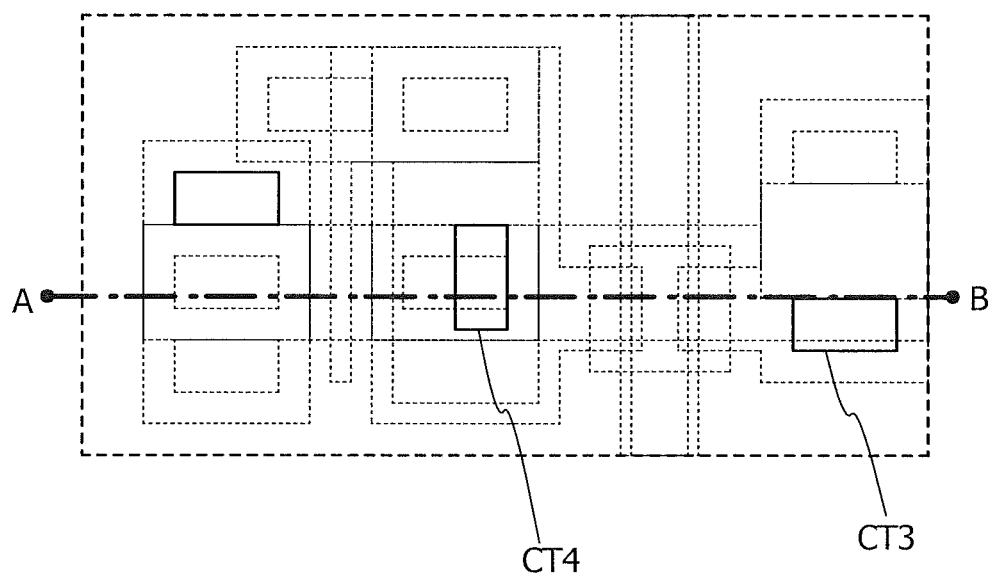
FIGS. 26A and 26B are a layout diagram and a schematic cross-sectional view for illustrating one embodiment of the present invention.
Figure 26B:
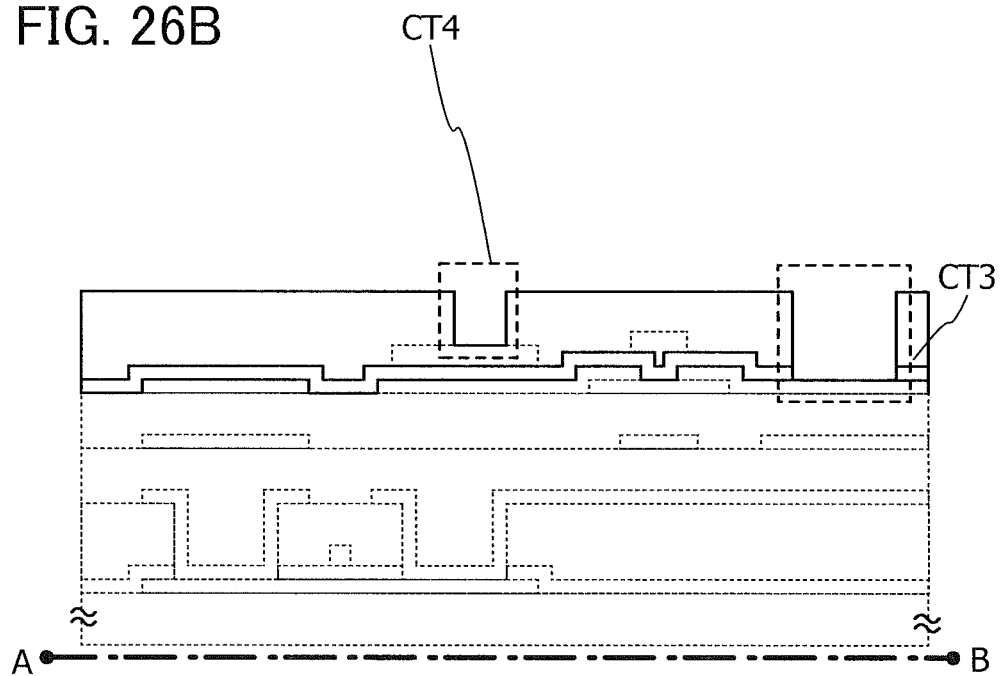

FIGS. 26A and 26B are a layout diagram and a schematic cross-sectional view of the openings CT3 and CT4 and an opening formed at the same level.

Figure 27A:
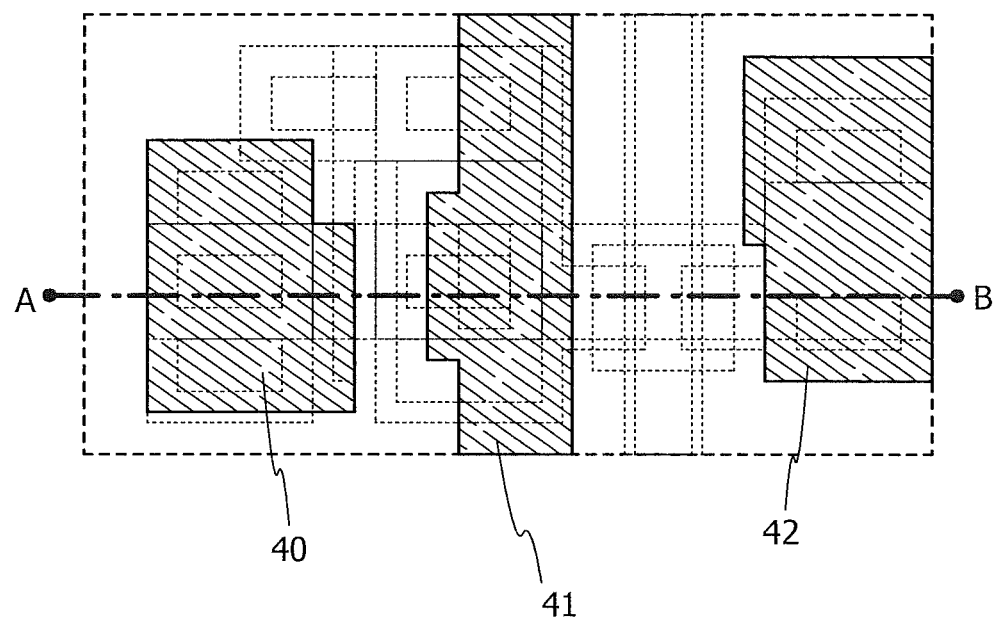
FIGS. 27A and 27B are a layout diagram and a schematic cross-sectional view for illustrating one embodiment of the present invention.
Figure 27B:
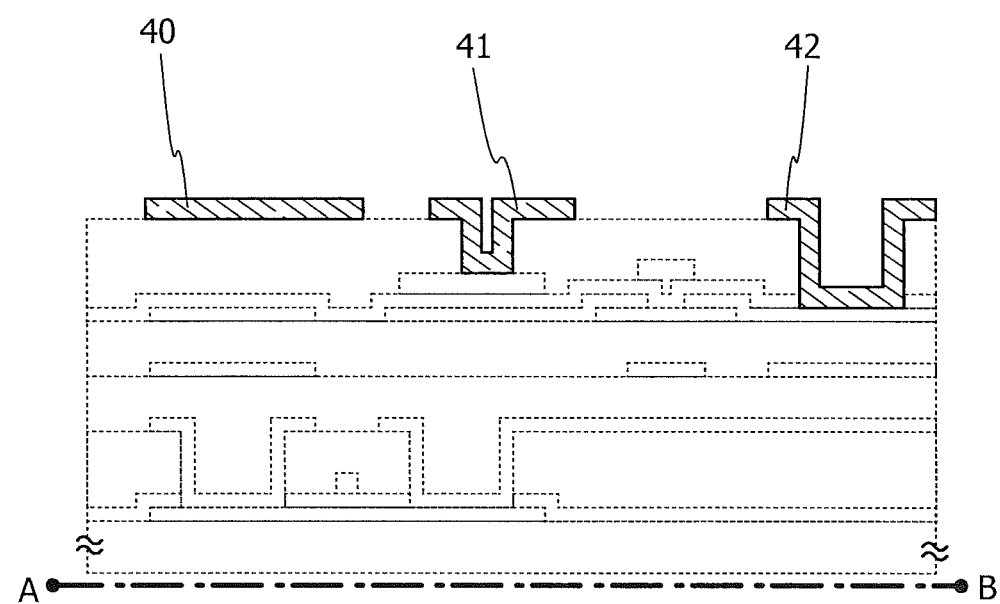

FIGS. 27A and 27B are a layout diagram and a schematic cross-sectional view of the conductive layers 40, 41, and 42.

Figure 28A:
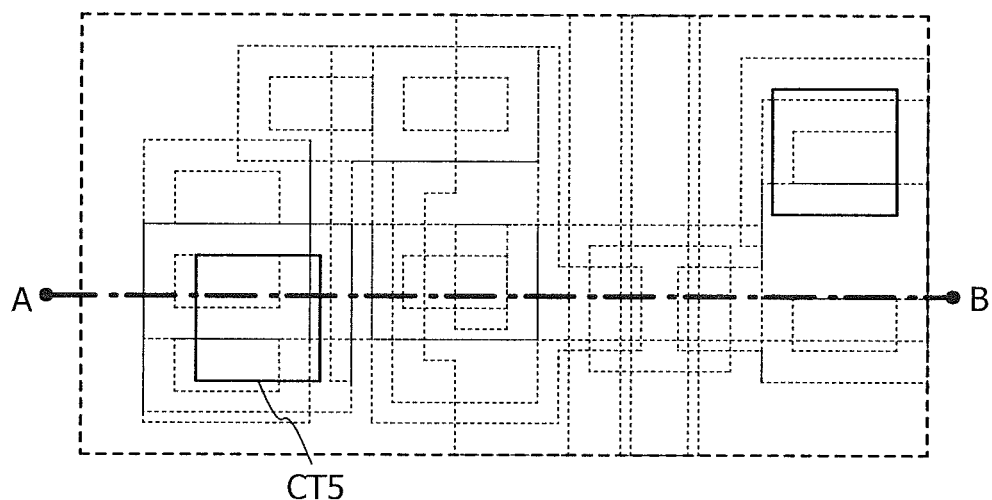
FIGS. 28A and 28B are a layout diagram and a schematic cross-sectional view for illustrating one embodiment of the present invention.
Figure 28B:
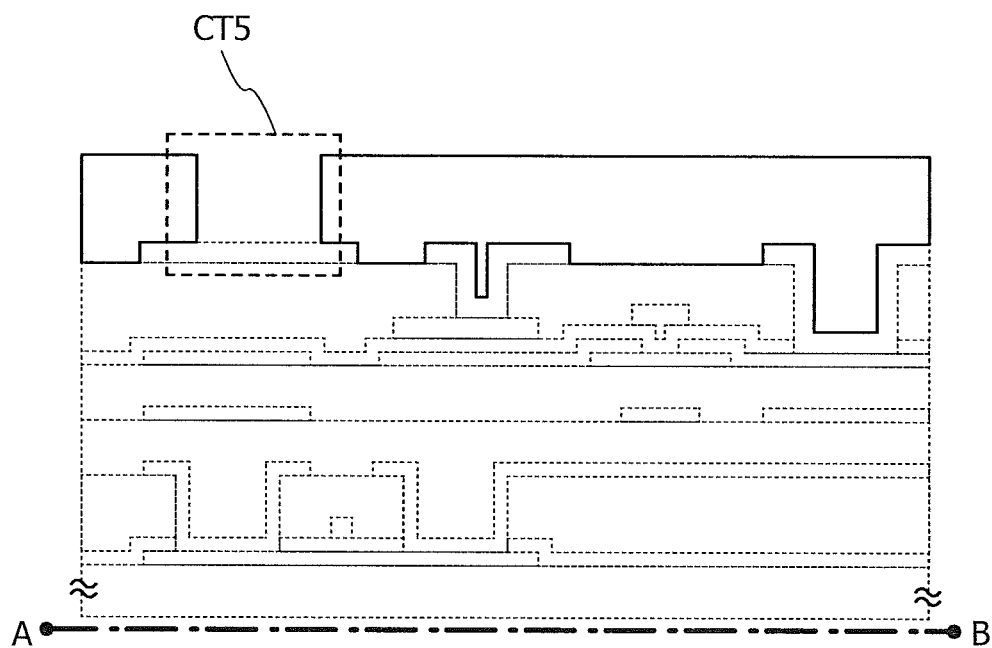

FIGS. 28A and 28B are a layout diagram and a schematic cross-sectional view of the opening CT5 and an opening formed at the same level.

Figure 29A:
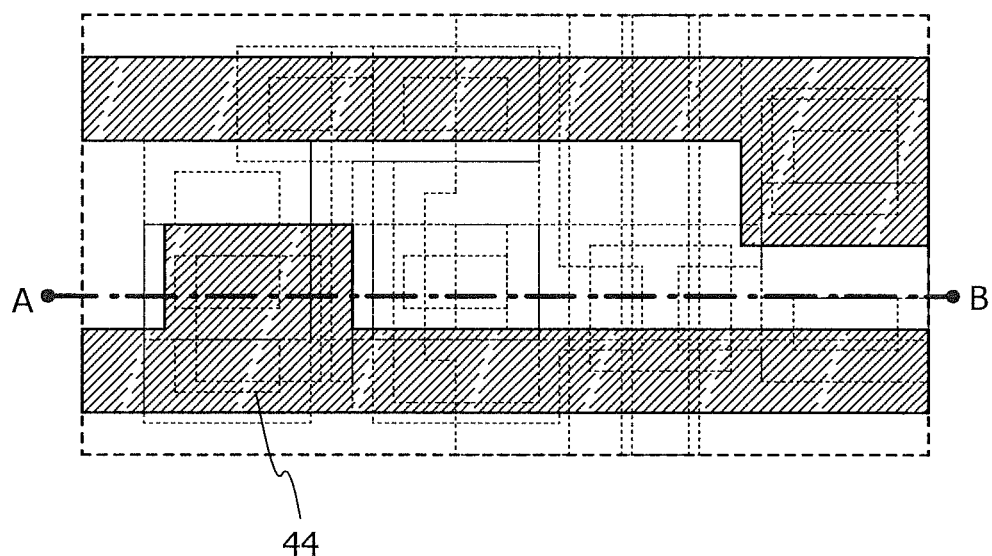
FIGS. 29A and 29B are a layout diagram and a schematic cross-sectional view for illustrating one embodiment of the present invention.
Figure 29B:
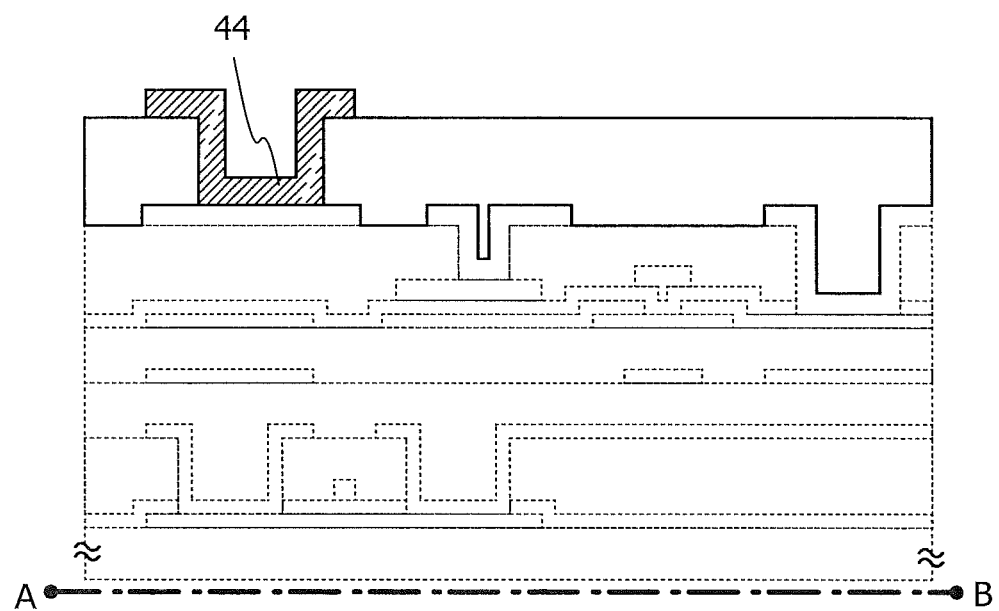

FIGS. 29A and 29B are a layout diagram and a schematic cross-sectional view of the conductive layer 44 and a conductive layer formed at the same level.

As shown in the layout diagram of FIG. 13A, the conductive layers 34 and 35 in contact with the semiconductor layer 32 are preferably provided not to completely cover end portions of the semiconductor layer 32. This structure reduces the area where the conductive layers 34 and 35 overlap with the conductive layers 30 and 38, thereby reducing parasitic capacitance between the conductive layers. Thus, it is possible to suppress a change in potential of the conductive layers 34 and 35 due to a change in potential of the conductive layers 30 and 38.

Note that the structures, methods, and the like described in this embodiment can be used as appropriate in combination with any of the structures, methods, and the like described in the other embodiments.

(Embodiment 5)

Although the conductive layer and the semiconductor layer described in the above embodiments can be formed by sputtering, they may be formed by another method, for example, a thermal CVD method. Examples of a thermal CVD method include a metal organic chemical vapor deposition (MOCVD) method and an atomic layer deposition (ALD) method.

A thermal CVD method has an advantage that no defect due to plasma damage is generated because it does not utilize plasma for forming a film.

Deposition by a thermal CVD method may be performed in such a manner that a source gas and an oxidizer are supplied to a chamber at a time, the pressure in the chamber is set to an atmospheric pressure or a reduced pressure, and reaction is caused in the vicinity of a substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For instance, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the second source gas may be introduced after the first source gas is exhausted by vacuum evacuation instead of the introduction of the inert gas. The first source gas is adsorbed on the surface of a substrate to form a first layer, and then, the second source gas is introduced to react with the first layer. As a result, a second layer is stacked over the first layer, so that a thin film is formed. The sequence of the gas introduction is repeated multiple times until a desired thickness is obtained, whereby a thin film with excellent step coverage can be formed. The thickness of the thin film can be adjusted by the number of repetitions of the sequence of the gas introduction; therefore, an ALD method makes it possible to accurately adjust a thickness and thus is suitable for manufacturing a minute FET.

The conductive film and the semiconductor film described in the above embodiments can be formed by thermal CVD such as MOCVD or ALD. For example, trimethylindium, trimethylgallium, and dimethylzinc are used to form an In—Ga—Zn—O film. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium, and diethylzinc (chemical formula: $Zn(C_2H_5)_2$) can be used instead of dimethylzinc.

For example, when a tungsten film is formed with a deposition apparatus using ALD, a $WF_6$ gas and a $B_2H_6$ gas are sequentially introduced multiple times to form an initial tungsten film, and then a $WF_6$ gas and an $H_2$ gas are introduced at a time, so that a tungsten film is formed. Note that a $SiH_4$ gas may be used instead of a $B_2H_6$ gas.

When an oxide semiconductor film, for example, an In—Ga—Zn—O film is formed with a deposition apparatus using ALD, an $In(CH_3)_3$ gas and an $O_3$ gas are sequentially introduced multiple times to form an In—O layer, a $Ga(CH_3)_3$ gas and an $O_3$ gas are introduced at a time to form a Ga—O layer, and then a $Zn(CH_3)_2$ gas and an $O_3$ gas are introduced at a time to form a Zn—O layer. Note that the order of these layers is not limited to this example. A mixed compound layer such as an In—Ga—O layer, an In—Zn—O layer, or a Ga—Zn—O layer may be formed by mixing of these gases. Although an $H_2O$ gas obtained by bubbling with an inert gas such as Ar may be used instead of an $O_3$ gas, it is preferable to use an $O_3$ gas, which does not contain H. Furthermore, an $In(C_2H_5)_3$ gas may be used instead of an $In(CH_3)_3$ gas. A $Ga(C_2H_5)_3$ gas may be used instead of a $Ga(CH_3)_3$ gas. Moreover, a $Zn(CH_3)_2$ gas may be used.

The structure described above in this embodiment can be combined as appropriate with any of the structures described in the other embodiments.

(Embodiment 6)

In this embodiment, application examples of the semiconductor device described in the foregoing embodiments to an electronic component and to an electronic device including the electronic component will be described with reference to FIGS. 15A and 15B and FIGS. 16A to 16E.

Figure 15A:
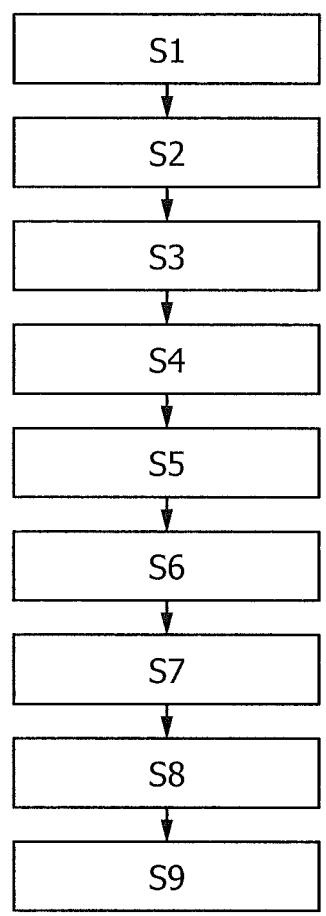
FIG. 15A is a flowchart showing a fabrication process of an electronic component.

FIG. 15A shows an example where the semiconductor device described in the foregoing embodiment is used to make an electronic component. Note that an electronic component is also referred to as semiconductor package or IC package. For the electronic component, there are various standards and names corresponding to the direction of terminals or the shape of terminals; hence, one example of the electronic component will be described in this embodiment.

Figure 13B:
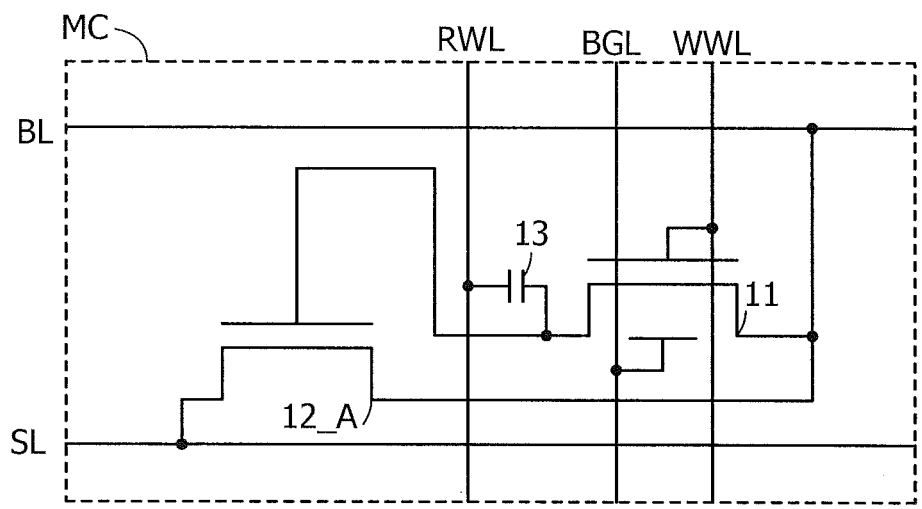

A semiconductor device including the transistors illustrated in FIGS. 13A and 13B and FIG. 14 of Embodiment 4 is completed by integrating detachable components on a printed circuit board through the assembly process (post-process).

The post-process can be completed through steps shown in FIG. 15A. Specifically, after an element substrate obtained in the wafer process is completed (Step S1), a back surface of the substrate is ground (Step S2). The substrate is thinned in this step to reduce warpage or the like of the substrate in the wafer process and to reduce the size of the component itself.

A dicing step of grinding the back surface of the substrate to separate the substrate into a plurality of chips is performed. Then, a die bonding step of individually picking up separate chips to be mounted on and bonded to a lead frame is performed (Step S3). To bond a chip and a lead frame in the die bonding step, resin bonding, tape-automated bonding, or the like is selected as appropriate depending on products. Note that in the die bonding step, a chip may be mounted on and bonded to an interposer.

Next, wire bonding for electrically connecting a lead of the lead frame and an electrode on a chip through a metal wire is performed (Step S4). As a metal wire, a silver wire or a gold wire can be used. For wire bonding, ball bonding or wedge bonding can be employed.

A wire-bonded chip is subjected to a molding step of sealing the chip with an epoxy resin or the like (Step S5). With the molding step, the inside of the electronic component is filled with a resin, thereby reducing damage to the circuit portion and the wire embedded in the component caused by external mechanical force as well as reducing deterioration of characteristics due to moisture or dust.

Subsequently, the lead of the lead frame is plated. Then, the lead is cut and processed into a predetermined shape (Step S6). With the plating process, corrosion of the lead can be prevented, and soldering for mounting the electronic component on a printed circuit board in a later step can be performed with higher reliability.

Next, printing process (marking) is performed on a surface of the package (Step S7). Then, through a final test step (Step S8), the electronic component is completed (Step S9).

Since the electronic component described above includes the semiconductor device described in the foregoing embodiment, it is possible to obtain a highly reliable electronic component.

Figure 15B:
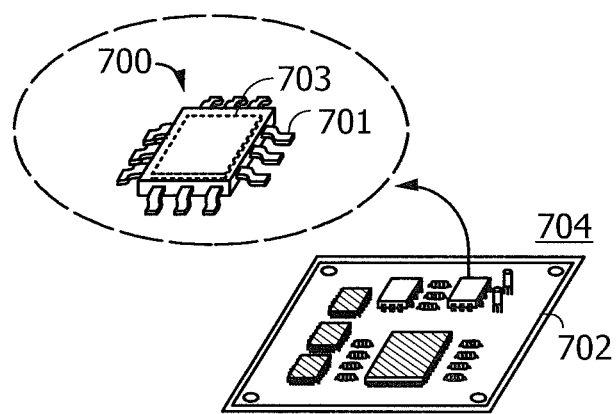
FIG. 15B is a schematic cross-sectional view of the electronic component.

FIG. 15B is a schematic perspective diagram of a completed electronic component. FIG. 15B shows a schematic perspective diagram of a quad flat package (QFP) as an example of the electronic component. An electronic component 700 illustrated in FIG. 15B includes a lead 701 and a circuit portion 703. The electronic component 700 in FIG. 15B is, for example, mounted on a printed circuit board 702. A combination of electronic components 700 electrically connected to each other over the printed circuit board 702 can be equipped in an electronic device. A completed circuit board 704 is provided in an electronic device or the like.

Next, the description is made on applications of the above electronic component to electronic devices such as a computer, a portable information appliance (including a mobile phone, a portable game machine, and an audio reproducing device), electronic paper, a television device (also referred to as television or television receiver), and a digital video camera.

Figure 16A:
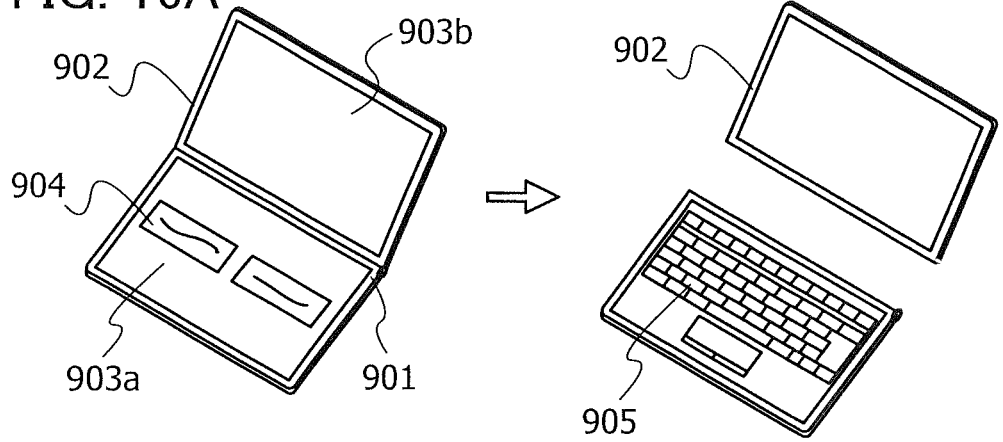
FIGS. 16A to 16E each illustrate an electronic device including an electronic component.

FIG. 16A illustrates a portable information appliance that includes a housing 901, a housing 902, a first display portion 903a, a second display portion 903b, and the like. At least one of the housings 901 and 902 is provided with the semiconductor device of the foregoing embodiment. It is thus possible to obtain a highly reliable portable information appliance.

Note that the first display portion 903a is a panel having a touch input function, and for example, as illustrated in the left of FIG. 16A, which of "touch input" and "keyboard input" is performed can be selected by a selection button 904 displayed on the first display portion 903a. Since selection buttons with a variety of sizes can be displayed, the information appliance can be easily used by people of any generation. For example, when "keyboard input" is selected, a keyboard 905 is displayed on the first display portion 903*a* as illustrated in the right of FIG. 16A. Thus, letters can be input quickly by key input as in a conventional information appliance, for example.

One of the first display portion 903*a* and the second display portion 903*b* can be detached from the portable information appliance as shown in the right of FIG. 16A. Providing the second display portion 903*b* with a touch input function makes the information appliance convenient to carry because a weight to carry around can be further reduced and the information appliance can operate with one hand while the other hand supports the housing 902.

The portable information appliance in FIG. 16A can be equipped with a function of displaying a variety of information (e.g., a still image, a moving image, and a text image); a function of displaying a calendar, a date, the time, or the like on the display portion; a function of operating or editing information displayed on the display portion; a function of controlling processing by various kinds of software (programs); and the like. Furthermore, an external connection terminal (e.g., an earphone terminal or a USB terminal), a recording medium insertion portion, and the like may be provided on the back surface or the side surface of the housing.

The portable information appliance illustrated in FIG. 16A may transmit and receive data wirelessly. Through wireless communication, desired book data or the like can be purchased and downloaded from an e-book server.

In addition, the housing 902 illustrated in FIG. 16A may be equipped with an antenna, a microphone function, and a wireless communication function to be used as a mobile phone.

Figure 16B:
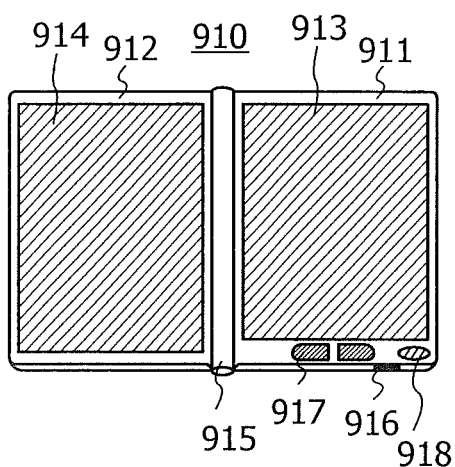

FIG. 16B illustrates an e-book reader 910 including electronic paper. The e-book reader 910 has two housings 911 and 912. The housing 911 and the housing 912 are provided with a display portion 913 and a display portion 914, respectively. The housings 911 and 912 are connected by a hinge 915 and can be opened and closed with the hinge 915 as an axis. The housing 911 is provided with a power switch 916, an operation key 917, a speaker 918, and the like. The semiconductor device of the foregoing embodiment is provided in at least one of the housings 911 and 912. It is thus possible to obtain a highly reliable e-book reader.

Figure 16C:
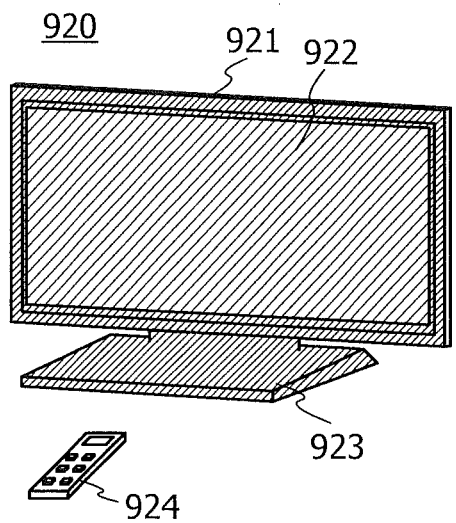

FIG. 16C illustrates a television device 920 including a housing 921, a display portion 922, a stand 923, and the like. The television device 920 can be controlled by a switch of the housing 921 and a separate remote controller 924. The semiconductor device of the foregoing embodiment is provided in the housing 921 and the remote controller 924. Thus, it is possible to obtain a highly reliable television device.

Figure 16D:
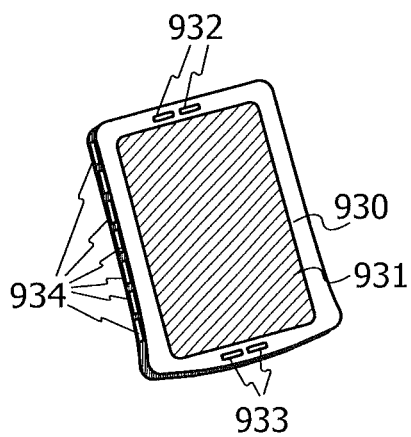

FIG. 16D illustrates a smartphone in which a main body 930 is provided with a display portion 931, a speaker 932, a microphone 933, an operation button 934, and the like. The semiconductor device of the foregoing embodiment is provided in the main body 930. It is thus possible to obtain a highly reliable smartphone.

Figure 16E:
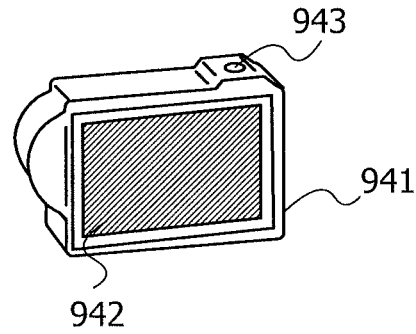

FIG. 16E illustrates a digital camera including a main body 941, a display portion 942, an operation switch 943, and the like. The semiconductor device of the foregoing embodiment is provided in the main body 941. Consequently, it is possible to obtain a highly reliable digital camera.

As described above, the electronic device shown in this embodiment includes the semiconductor device of the foregoing embodiment, thereby having high reliability.

EXAMPLE 1

In this example, a specific structure of a fabricated semiconductor device will be described.

Table 1 shows the specifications of the fabricated semiconductor device.

TABLE 1

| | |
|---|---|
| Bits per cell | 4 |
| Density | 128 kbit |
| Technology | 0.18-μm CMOS |
| | 0.35-μm CAAC-IGZO |
| Cell size | 34.23 μm$^2$ |
| | (8.15 μm × 4.2 μm) |
| Organization | 128 rows × |
| | 8 × 32 columns |
| Input and output | 32 bit |
| Write performance ($T_{write}$) | 200 ns |
| Read performance ($T_{read}$) | 900 ns |
| Write cycle | 270 ns |
| Read cycle | 1170 ns |
| Write power | 6.65 mW |
| Read power | 6.44 mW |
| Power supply | VDD/VDM = 1.8 V/3.5 V |
| | VH/VL = 4.6 V/−1 V |

Figure 30:
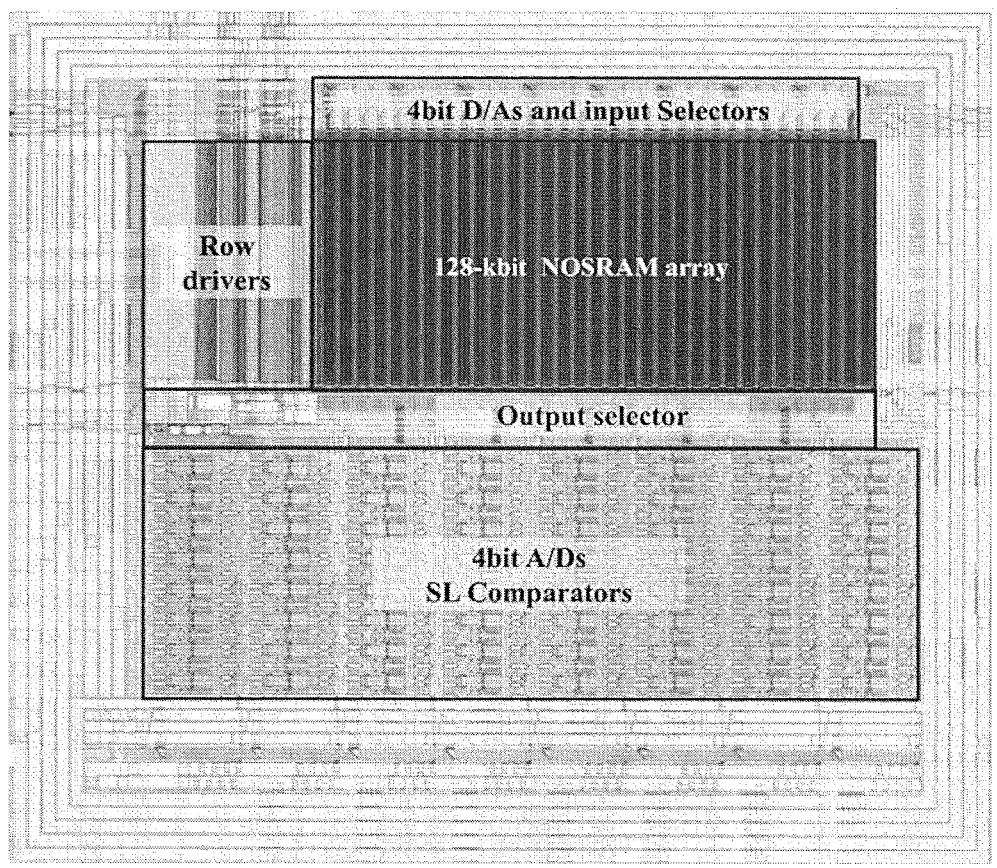
FIG. 30 is a chip photograph showing Example 1.

FIG. 30 is a chip photograph of the fabricated semiconductor device.

Memory cells included in the semiconductor device had the circuit configuration in FIG. 1 of Embodiment 1. The memory cells operated according to the operations in FIGS. 2A and 2B and FIGS. 3A to 3C of Embodiment 1. Peripheral circuits of the memory cells employed the configuration in FIG. 4 of Embodiment 1. The semiconductor device operated according to the timing charts in FIG. 5 and FIG. 6 of Embodiment 1.

By employing the above-described configurations and operations, the fabricated semiconductor device achieved highly precise control of the amount of charge and narrow distribution of cell threshold voltages, thereby retaining multilevel data such as 16-bit data (i.e., realizing 4-bit/cell memory).

Figure 31:
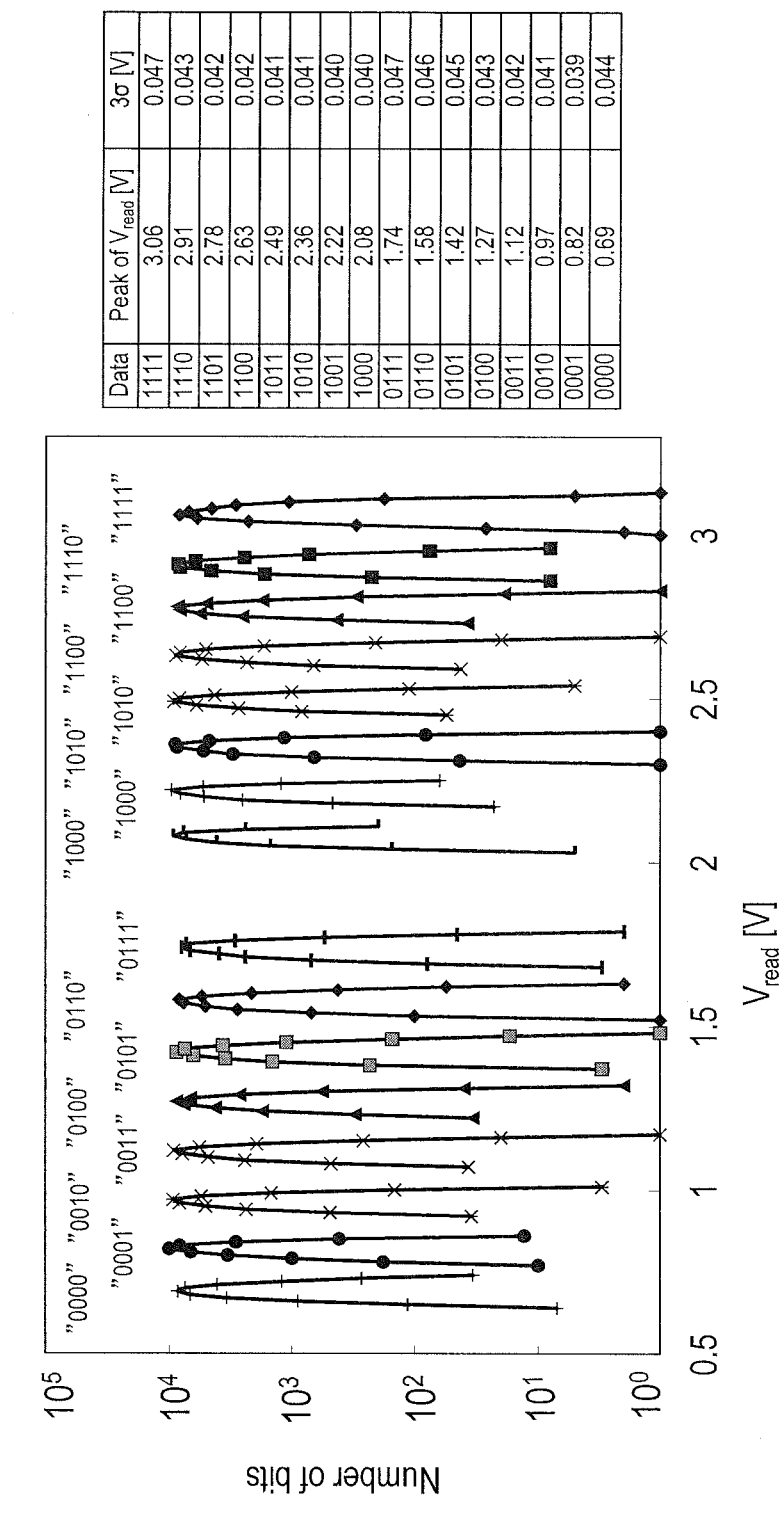
FIG. 31 shows a graph for explaining Example 1.

FIG. 31 shows the relation between the number of bits and read voltages obtained by reading operation. As seen from FIG. 31, read voltages corresponding to 16 bits were narrowly distributed and had sharp peaks, and 3σ was 47 mV at the maximum. The distributions of the obtained read voltages were separated from each other without overlapping.

EXAMPLE 2

In this example, a specific structure of a fabricated semiconductor device different from that in Example 1 will be described. The semiconductor device of Example 2 differs from that of Example 1 in that voltage follower circuits are substituted for 4-bit A/D converters.

This example will show the time for writing multilevel data, write endurance, and operations of writing and reading multilevel data in the semiconductor device including the voltage follower circuits. Note that the circuit configuration and operation of memory cells were those described in Embodiment 1.

Figure 32:
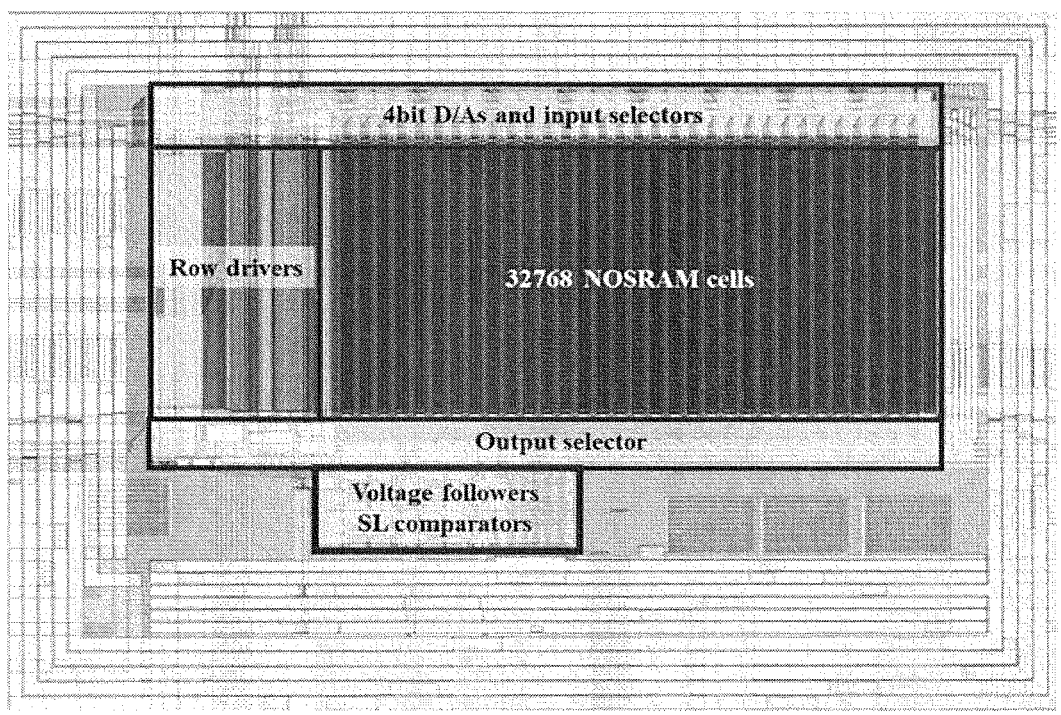
FIG. 32 is a chip photograph showing Example 2.

FIG. 32 is a photograph showing the appearance of the fabricated semiconductor device. Table 2 shows the specifications of the semiconductor device. The area of the voltage follower circuits in the semiconductor device was smaller than that of the A/D converters in the semiconductor device fabricated in Example 1.

TABLE 2

| Multilevel | 16 |
|---|---|
| Technology | 0.18-μm CMOS, 0.35-μm CAAC-IGZO |
| Cell size | 34.23 μm² (8.15 μm × 4.2 μm) |
| Organization | 128 rows × 8 × 32 columns |
| Access cell number | 8 |
| Write performance ($T_{write}$) | 200 ns |
| Read performance ($T_{read}$) | 10 μs |
| Power supply | VDD/VDM/VH/VSS/VL = 1.8 V/3.5 V/ 4.6 V/0 V/−1 V |

Figure 33:
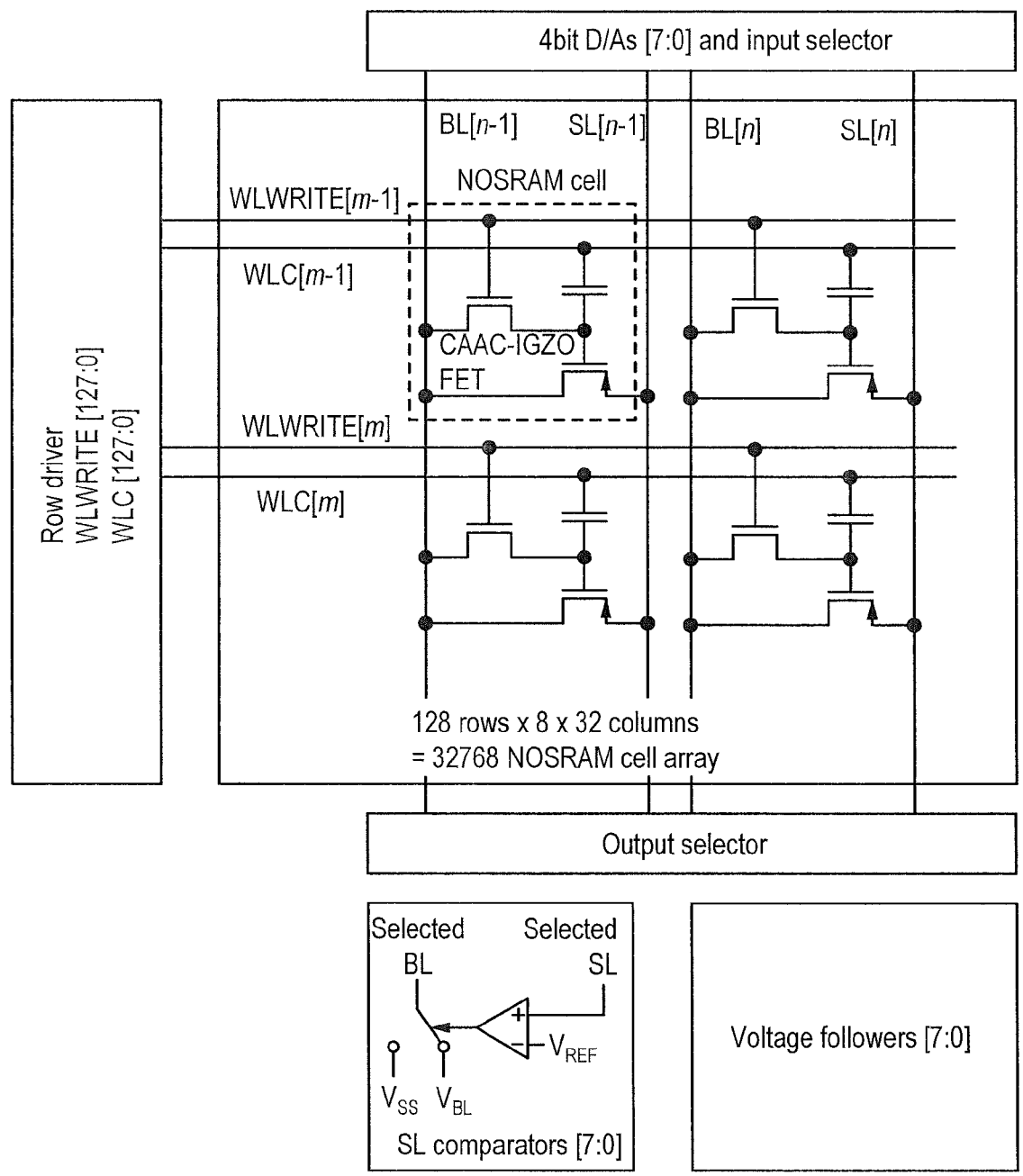
FIG. 33 is a block diagram illustrating Example 2.

FIG. 33 is a block diagram of the fabricated semiconductor device including memory cells. The semiconductor device consists of a memory cell array, a row driver, an input selector, an output selector, comparators, and voltage follower circuits.

Figure 34:
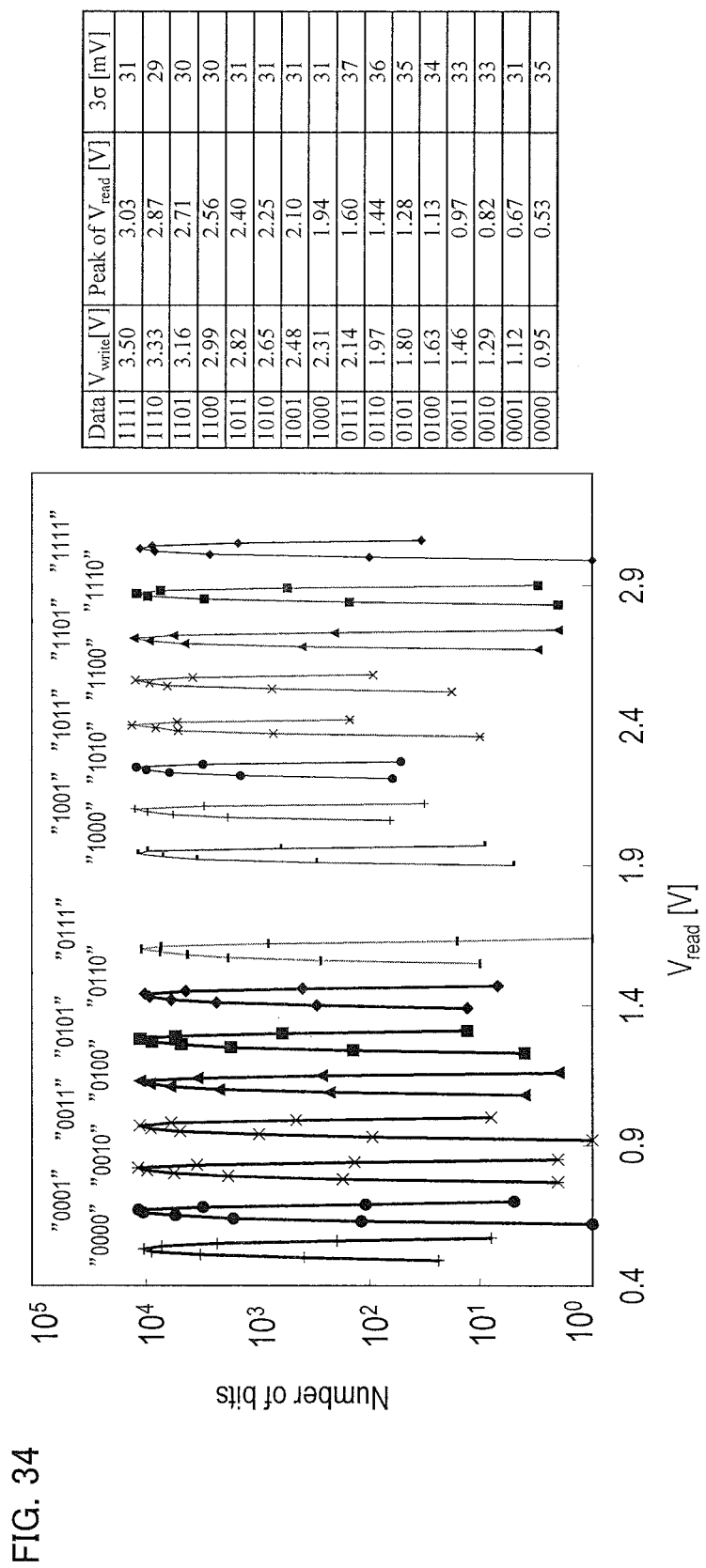
FIG. 34 shows a graph for explaining Example 2.

FIG. 34 shows the distribution of cell threshold voltages of the memory cell. It was found from FIG. 34 that the distributions of 16 levels were separated without overlapping. In the distributions of read voltages corresponding to 16 bits, 3σ was 37 mV at the maximum.

Figure 35A:
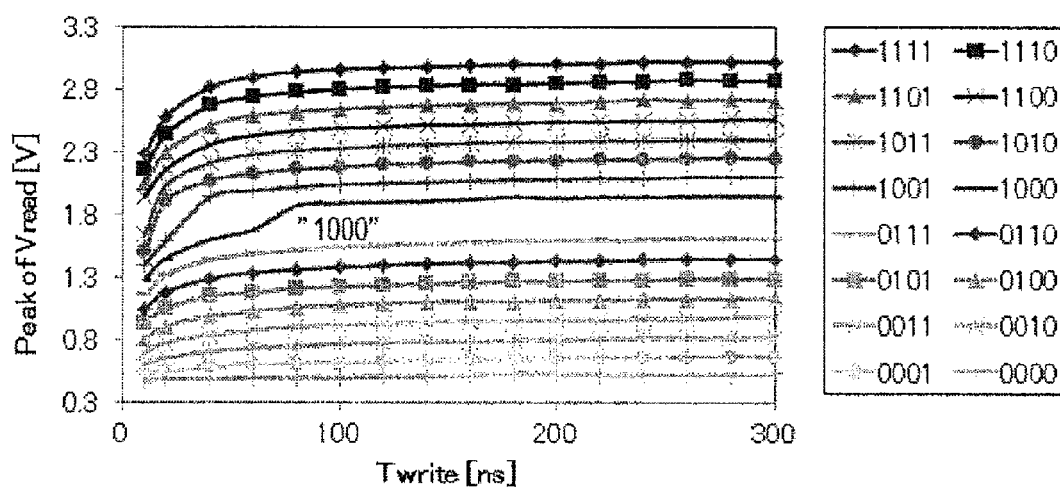
FIGS. 35A and 35B are graphs for explaining Example 2.
Figure 35B:
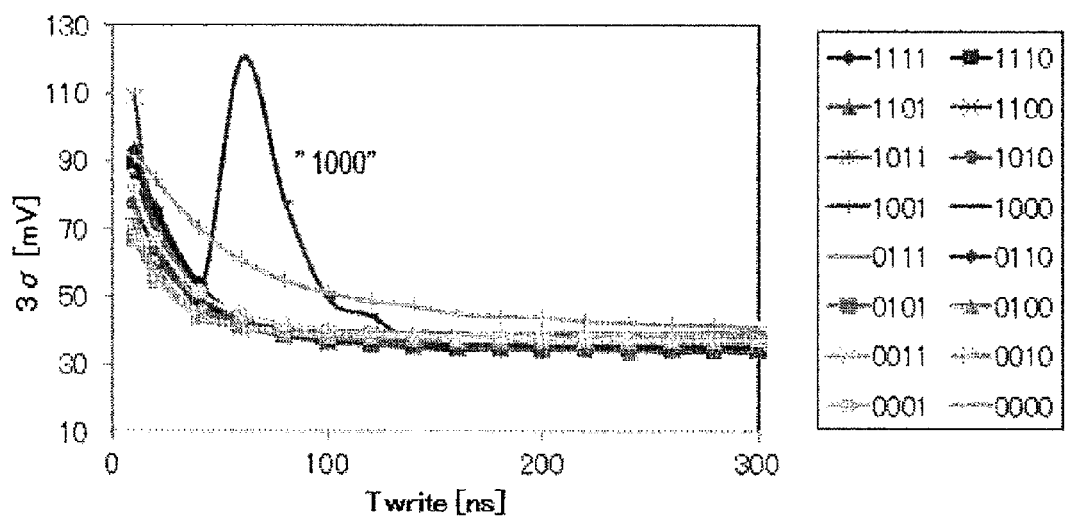

FIG. 35A is a graph showing the relation between the write performance $T_{write}$ and the peak of the cell threshold voltage. FIG. 35B is a graph showing the relation between the write performance $T_{write}$ and 3σ of the cell threshold voltage. The fabricated semiconductor device demonstrated that the threshold voltages of the memory cell written with 4-bit data and their distribution were converged with $T_{write}$ of 200 ns. Note that in the case where data "1000" is written, an effect of variation due to potential switching of a bit line was found.

Figure 36:
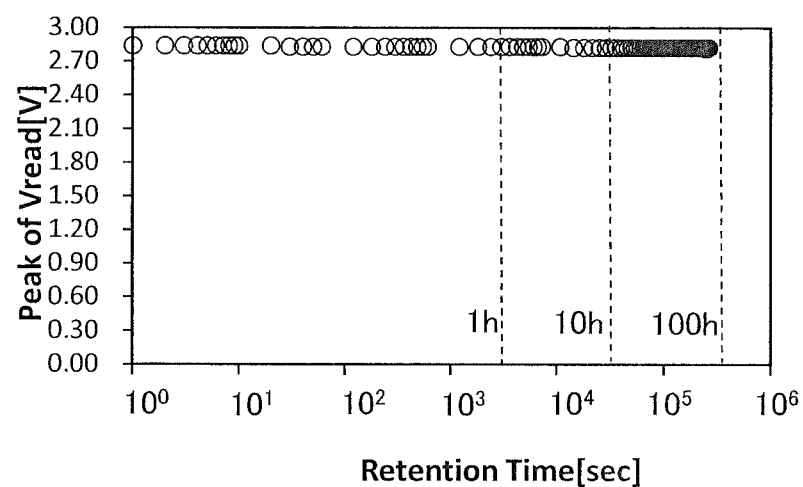
FIG. 36 is a graph for explaining Example 2.

FIG. 36 shows retention at 27° C. Measuring retention of data "1110" ensured that a cell threshold voltage decreased by approximately 30 mV in 130-hour retention. Assuming that a voltage between the peaks of cell threshold voltages of data was 170 mV and 3σ of each cell threshold voltage was 37 mV, the retention margin was 96 mV. Accordingly, data retention of the semiconductor device was estimated at 17 days.

This application is based on Japanese Patent Applications serial no. 2014-091432, no. 2014-180982, and no. 2015-016508 filed with Japan Patent Office on Apr. 25, 2014, Sep. 5, 2014, and Jan. 30, 2015, respectively, the entire contents of which are hereby incorporated by reference.

What is claimed is:

1. A semiconductor device comprising:
a memory cell including a first transistor and a second transistor;
a first switch;
a second switch;
a third switch;
a first wiring directly connected to the memory cell;
a second wiring electrically connected to the first wiring directly through the first switch;
a third wiring supplied with a first potential, the third wiring electrically connected to the second wiring directly through the second switch; and
a fourth wiring supplied with a second potential different from the first potential, the fourth wiring electrically connected to the second wiring directly through the third switch,
wherein each of the first switch, the second switch, and the third switch is different from the first transistor and the second transistor.

2. The semiconductor device according to claim 1, further comprising:
a fourth switch; and
a fifth wiring,
wherein the fifth wiring is electrically connected to the first wiring through the fourth switch.

3. The semiconductor device according to claim 1, wherein the second switch is on state when the third switch is off state.

4. The semiconductor device according to claim 1, further comprising:
a fourth switch;
a fifth switch;
a sixth switch;
a fifth wiring directly connected to the memory cell;
a sixth wiring electrically connected to the fifth wiring directly through the fourth switch;
a seventh wiring supplied with a third potential, the seventh wiring electrically connected to the sixth wiring directly through the fifth switch; and
a eighth wiring supplied with a fourth potential, the eighth wiring electrically connected to the sixth wiring directly through the sixth switch.

5. The semiconductor device according to claim 4, wherein the second potential is the same with the fourth potential.

6. A semiconductor device comprising:
a first transistor;
a second transistor;
a capacitor;
a first switch;
a second switch;
a third switch;
a first wiring;
a second wiring electrically connected to the first wiring directly through the first switch;
a third wiring supplied with a first potential, the third wiring electrically connected to the second wiring directly through the second switch; and
a fourth wiring supplied with a second potential different from the first potential, the fourth wiring electrically connected to the second wiring directly through the third switch,
wherein one of a source and a drain of the first transistor is directly connected to the first wiring,
wherein one of a source and a drain of the second transistor is directly connected to the first wiring,
wherein the other of the source and the drain of the second transistor is electrically connected to a node,
wherein a gate of the first transistor is electrically connected to the node,
wherein a first terminal of the capacitor is electrically connected to the node, and
wherein each of the first switch, the second switch, and the third switch is different from the first transistor and the second transistor.

7. The semiconductor device according to claim 6, wherein the first transistor comprises a semiconductor layer comprising silicon.

8. The semiconductor device according to claim 6, wherein the second transistor comprises a semiconductor layer comprising an oxide semiconductor.

9. The semiconductor device according to claim 6, further comprising:
a fourth switch; and
a fifth wiring,
wherein the fifth wiring is electrically connected to the first wiring through the fourth switch.

10. The semiconductor device according to claim 6, wherein the second switch is on state when the third switch is off state.

11. The semiconductor device according to claim 6, further comprising:
a fourth switch;
a fifth switch;
a sixth switch;
a fifth wiring directly connected to the other of the source and the drain of the first transistor;
a sixth wiring electrically connected to the fifth wiring directly through the fourth switch;
a seventh wiring supplied with a third potential, the seventh wiring electrically connected to the sixth wiring directly through the fifth switch; and
a eighth wiring supplied with a fourth potential, the eighth wiring electrically connected to the sixth wiring directly through the sixth switch.

12. The semiconductor device according to claim 11, wherein the second potential is the same with the fourth potential.

13. A semiconductor device comprising:
a first transistor;
a second transistor;
a capacitor;
a first switch;
a multiplexer capable of outputting one of a first potential, a second potential, third potential;
a first wiring;
a second wiring electrically connected to the first wiring directly through the first switch;
wherein an output of the multiplexer is directly connected to the second wiring;
wherein one of a source and a drain of the first transistor is directly connected to the first wiring,
wherein one of a source and a drain of the second transistor is directly connected to the first wiring,
wherein the other of the source and the drain of the second transistor is electrically connected to a node,
wherein a gate of the first transistor is electrically connected to the node,
wherein a first terminal of the capacitor is electrically connected to the node, and
wherein the first switch is different from the first transistor and the second transistor.

14. The semiconductor device according to claim 13, wherein the first transistor comprises a semiconductor layer comprising silicon.

15. The semiconductor device according to claim 13, wherein the second transistor comprises a semiconductor layer comprising an oxide semiconductor.

16. The semiconductor device according to claim 13, further comprising:
a second switch; and
a third wiring,
wherein the third wiring is electrically connected to the first wiring through the second switch.

17. The semiconductor device according to claim 13, further comprising:
a second switch;
a third switch;
a fourth switch;
a third wiring directly connected to the other of the source and the drain of the first transistor;
a fourth wiring electrically connected to the third wiring directly through the second switch;
a fifth wiring supplied with a fourth potential, the fifth wiring electrically connected to the fourth wiring directly through the third switch; and
a sixth wiring supplied with a fifth potential, the sixth wiring electrically connected to the fourth wiring directly through the fourth switch.

18. The semiconductor device according to claim 17, wherein the third potential is the same with the fifth potential.

19. The semiconductor device according to claim 1, wherein the memory cell further includes a capacitor.

* * * * *